United States Patent
Xie et al.

(10) Patent No.: US 10,410,933 B2
(45) Date of Patent: Sep. 10, 2019

(54) REPLACEMENT METAL GATE PATTERNING FOR NANOSHEET DEVICES

(71) Applicant: GLOBALFOUNDRIES INC., Grand Cayman (KY)

(72) Inventors: Ruilong Xie, Schenectady, NY (US); Chanro Park, Clifton Park, NY (US); Min Gyu Sung, Latham, NY (US); Hoon Kim, Horseheads, NY (US); Hui Zang, Guilderland, NY (US); Guowei Xu, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 31 days.

(21) Appl. No.: 15/602,225

(22) Filed: May 23, 2017

(65) Prior Publication Data
US 2018/0342427 A1 Nov. 29, 2018

(51) Int. Cl.
*H01L 21/3213* (2006.01)
*H01L 21/8238* (2006.01)
(Continued)

(52) U.S. Cl.
CPC ...... *H01L 21/823878* (2013.01); *B82Y 10/00* (2013.01); *H01L 21/32133* (2013.01);
(Continued)

(58) Field of Classification Search
CPC ....... H01L 21/02603; H01L 21/823828; H01L 21/823842; H01L 21/823878
See application file for complete search history.

(56) References Cited

U.S. PATENT DOCUMENTS 9,324,710 B2  4/2016  Leobandung
9,653,289 B1  5/2017  Balakrishnan et al.
(Continued)

FOREIGN PATENT DOCUMENTS

WO    2015047341 A1    4/2015

OTHER PUBLICATIONS

TW Office Action and Search Report for Taiwanese Patent Application No. 10820309620 dated Feb. 24, 2019, 9 pages.

*Primary Examiner* — Mohsen Ahmadi
*Assistant Examiner* — Christopher M Roland
(74) *Attorney, Agent, or Firm* — Anthony Canale; Hoffman Warnick LLC

(57) ABSTRACT

This disclosure relates to a method of replacement metal gate patterning for nanosheet devices including: forming a first and a second nanosheet stack on a substrate, the first and the second nanosheet stacks being adjacent to each other and each including vertically adjacent nanosheets separated by a distance; depositing a first metal surrounding the first nanosheet stack and a second portion of the first metal surrounding the second nanosheet stack; forming an isolation region between the first nanosheet stack and the second nanosheet stack; removing the second portion of the first metal surrounding the second nanosheet stack with an etching process, the isolation region preventing the etching process from reaching the first portion of the first metal and thereby preventing removal of the first portion of the first metal; and depositing a second metal surrounding each of the nanosheets of the second nanosheet stack.

18 Claims, 17 Drawing Sheets

(51) Int. Cl.
    *H01L 29/775*     (2006.01)
    *H01L 29/66*     (2006.01)
    *H01L 27/092*     (2006.01)
    *H01L 29/78*     (2006.01)
    *B82Y 10/00*     (2011.01)
    *H01L 29/40*     (2006.01)
    *H01L 29/423*     (2006.01)
    *H01L 29/06*     (2006.01)
    *H01L 21/02*     (2006.01)

(52) U.S. Cl.
CPC ............ *H01L 21/32139* (2013.01); *H01L 21/823842* (2013.01); *H01L 27/092* (2013.01); *H01L 29/0673* (2013.01); *H01L 29/401* (2013.01); *H01L 29/42392* (2013.01); *H01L 29/66439* (2013.01); *H01L 29/66545* (2013.01); *H01L 29/775* (2013.01); *H01L 29/785* (2013.01); *H01L 21/02603* (2013.01); *H01L 21/823828* (2013.01)

(56) References Cited

U.S. PATENT DOCUMENTS

| | | | |
|---|---|---|---|
| 9,653,480 B1 * | 5/2017 | Cheng | H01L 27/1211 |
| 9,997,519 B1 * | 6/2018 | Bao | H01L 27/092 |
| 10,103,065 B1 * | 10/2018 | Mochizuki | H01L 21/823842 |
| 2011/0121366 A1 | 5/2011 | Or-Bach et al. | |
| 2012/0306026 A1 * | 12/2012 | Guo | H01L 29/495 257/407 |
| 2014/0306291 A1 | 10/2014 | Alptekin et al. | |

\* cited by examiner

REPLACEMENT METAL GATE PATTERNING FOR NANOSHEET DEVICES

BACKGROUND

Technical Field

The present disclosure relates to integrated circuit design, and more particularly to forming work function metals for nanosheet transistor devices.

Related Art

A nanosheet transistor refers to a type of field-effect transistor (FET) that includes a plurality of stacked nanosheets extending between a pair of source/drain regions. FETs typically include doped source/drain regions that are formed in a semiconductor substrate and separated by a channel region. A gate insulation layer is positioned above the channel region and a conductive gate electrode is positioned above the gate insulation layer. The gate insulation layer and the gate electrode together may be referred to as the gate stack for the device. By applying an appropriate voltage to the gate electrode, the channel region becomes conductive and current is allowed to flow from the source region to the drain region.

To improve the operating speed of the FETs, and to increase the density of FETs on an integrated circuit (IC), designs have gradually become smaller in size. Reductions to the size and the channel length in FETs can improve the switching speed of the FETs. A number of challenges arise as feature sizes of FETs and ICs get smaller. For example, significant downsizing of traditional planar FETs may produce electrostatic issues and electron mobility degradation. Scaled-down planar FETs may have shorter gate lengths that make it more difficult to control the channel. New device architectures such as "gate-all-around" nanowire or nanosheet structures allow further scaling of ICs, in part because the gate is structured to wrap around the channel. This structure can provide better control with lower leakage current, faster operations, and lower output resistance.

In very small transistors such as nanosheet FETs, metal gates are used to avoid unwanted variations in threshold voltage. The threshold voltage of a FET is the minimum voltage required to create the conducting path between the source and drain. A metal gate is used together with a work function metal and a layer having a high dielectric constant (high-k) in a combination known as high-k metal gate (HKMG). The work function metal is typically located between the high-k layer and the metal gate, and is used to tune the threshold voltage of the transistor. Different transistors may require different threshold voltages, and therefore different work function metals. For example, a PFET (a FET with a channel that contains holes) may require a different work function metal than a NFET (a FET with a channel that contains electrons). In nanosheet devices, it may be important that the work function metal wraps completely around the nanosheets to form a sufficient, reliable contact.

Some integrated circuits, known as bimetallic integrated circuits, include both NFETs and PFETs. These bimetallic integrated circuits may require at least two different work function metals, one for PFETs and one for NFETs. In some cases, an integrated circuit design may include a PFET directly adjacent to a NFET. In such a scenario, it may be difficult to deposit the different work function metals completely around the nanosheets of the adjacent FETs. For example, after a first work function metal is applied to both FETs, the first work function metal must be removed from the FET that requires a second work function metal. Isotropic etching can remove the first work function metal from between the nanosheets of the FET that requires the second work function metal. Isotropic etching can etch away the work function metal from between the sheets of the target FET, but at the same time it will follow the layer of work function metal to the adjacent FET, creating an undercut. During the time required to remove the first work function metal from between the sheets of the target FET, the undercut may extend far enough to expose the nanosheets of the adjacent FET.

SUMMARY

A first aspect of the disclosure provides a method including: forming a first and a second nanosheet stack on a substrate, the first and the second nanosheet stacks being adjacent to each other and each including vertically adjacent nanosheets separated by a distance; depositing a first metal such that that a first portion of the first metal surrounds each of the nanosheets of the first nanosheet stack and a second portion of the first metal surrounds each of the nanosheets of the second nanosheet stack; forming an isolation region between the first nanosheet stack and the second nanosheet stack; removing the second portion of the first metal surrounding the second nanosheet stack with an etching process, the isolation region preventing the etching process from reaching the first portion of the first metal and thereby preventing removal of the first portion of the first metal; removing the isolation region; and depositing a second metal surrounding each of the nanosheets of the second nanosheet stack.

BRIEF DESCRIPTION OF THE DRAWINGS

The embodiments of this disclosure will be described in detail, with reference to the following figures, wherein like designations denote like elements, and wherein.

It is noted that the drawings of the disclosure are not to scale. The drawings are intended to depict only typical aspects of the disclosure, and therefore should not be considered as limiting the scope of the disclosure. In the drawings, like numbering represents like elements between the drawings.

DETAILED DESCRIPTION

Figure 1:
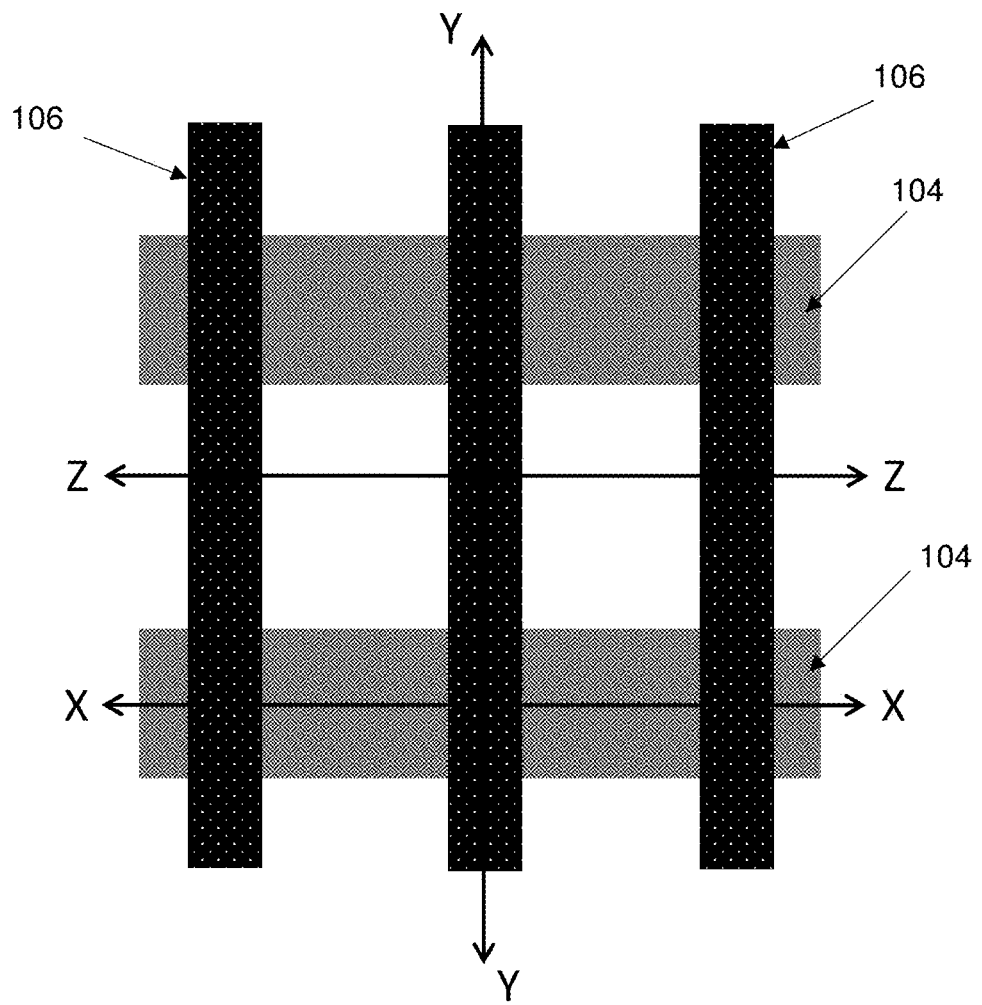
FIG. 1 shows a plan view of a plurality of nanosheet stacks and gate regions in accordance with the present disclosure.

Embodiments of the present disclosure provide methods for replacement metal gate patterning for nanosheet transistor devices that may be used in integrated circuits (IC). A nanosheet transistor refers to a transistor with a gate disposed on a nanosheet stack between a pair of source/drain regions, and a plurality of nanosheets extending between the pair of source/drain regions. The nanosheets are spaced apart vertically by sacrificial layers.

In very small transistors such as nanosheet FETs, metal gates are used to avoid unwanted variations in threshold voltage. The threshold voltage of a FET is the minimum voltage required to create the conducting path between the source and drain. A metal gate can be used together with a work function metal, and a layer of high dielectric constant (high-k) material to form a high-k metal gate (HKMG). The work function metal may be located between the high-k layer and the metal gate, and may be used to tune the threshold voltage of the transistor. Different transistors may require different threshold voltages, and therefore different work function metals. For example, a PFET (a FET with a channel that contains holes) may require a different work function metal than a NFET (a FET with a channel that contains electrons). In nanosheet devices, the work function metal can wrap completely around the nanosheets to form a more reliable contact.

Some integrated circuits, known as bimetallic integrated circuits, include both NFETs and PFETs. These bimetallic integrated circuits generally use two or more distinct work function metals, e.g., one for PFETs and one for NFETs. In some cases, an IC design may include a PFET directly adjacent to a NFET. In such a scenario, it may be difficult to deposit the different work function metals completely around the nanosheets of the adjacent FETs. For example, after a first work function metal is applied to both FETs, the first work function metal may need to be removed from the FET that requires a second work function metal. An isotropic etch may be required to remove the first work function metal from between the nanosheets of the FET that requires the second work function metal. An isotropic etch may include a wet etch or other chemical etch. The isotropic etch will etch away the work function metal from between the sheets of the target FET, but at the same time it will follow the layer of work function metal to the adjacent FET, creating an undercut. After the first work function metal is removed from between the sheets of the target FET, the resulting undercut may extend far enough to expose the nanosheets of the adjacent FET.

The present disclosure provides a method of replacement metal gate (HKRMG) patterning for nanosheet devices. In some embodiments, a gate cut isolation region can reduce or eliminate the undercut such that the undercut does not expose the adjacent nanosheets. The resulting integrated circuit (IC) may include two different work function metals deposited on adjacent nanosheet stacks.

It is to be understood that the present disclosure will be described in terms of a given illustrative architecture having a silicon substrate, however other architectures, structures, substrate materials, and process features and steps may be varied within the scope of the present disclosure.

It will also be understood that when an element such as a layer, region, or substrate is referred to as being "on" or "over" another element, it may be directly on the other element or intervening elements may also be present. In contrast, when an element is referred to as being "directly on" or "directly over" another element, there may are no intervening elements present. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

Methods as described herein may be used in the fabrication of IC chips. The resulting integrated circuit chips may be integrated with other chips, discrete circuit elements, and/or other signal processing devices as part of either (a) an intermediate product, such as a motherboard, or (b) an end product. The end product can be any product that includes integrated circuit chips.

Reference in the specification to "one embodiment" or "an embodiment" of the present disclosure, as well as other variations thereof, means that a particular feature, structure, characteristic, and so forth described in connection with the embodiment is included in at least one embodiment of the present disclosure. Thus, the phrases "in one embodiment" or "in an embodiment," as well as any other variations appearing in various places throughout the specification are not necessarily all referring to the same embodiment.

It is to be appreciated that the use of any of the following "/," "and/or," and "at least one of," for example, in the cases of "A/B," "A and/or B" and "at least one of A and B," is intended to encompass the selection of the first listed option (a) only, or the selection of the second listed option (B) only, or the selection of both options (A and B). As a further example, in the cases of "A, B, and/or C" and "at least one of A, B, and C," such phrasing is intended to encompass the first listed option (A) only, or the selection of the second listed option (B) only, or the selection of the third listed option (C) only, or the selection of the first and the second listed options (A and B), or the selection of the first and third listed options (A and C) only, or the selection of the second and third listed options (B and C) only, or the selection of all three options (A and B and C). This may be extended, as readily apparent by one of ordinary skill in the art, for as many items listed.

Referring now to the drawings in which like numerals represent the same or similar elements, FIG. 1 depicts a plan view of a plurality of nanosheet stacks 104 and gates 106. FIG. 1 shows the plurality of gates 106 extending between two adjacent nanosheet stacks 104. FIG. 1 shows cross-section line Y-Y which extends along a gate 106 and perpendicular to nanosheet stacks 104. FIG. 1 also shows cross-section line X-X which extends along a nanosheet stack 104 and perpendicular to the plurality of gates 106. FIG. 1 also shows a cross-section line Z-Z which extends perpendicular to the plurality of gates 106 and between nanosheet stacks 104.

Figure 2A:
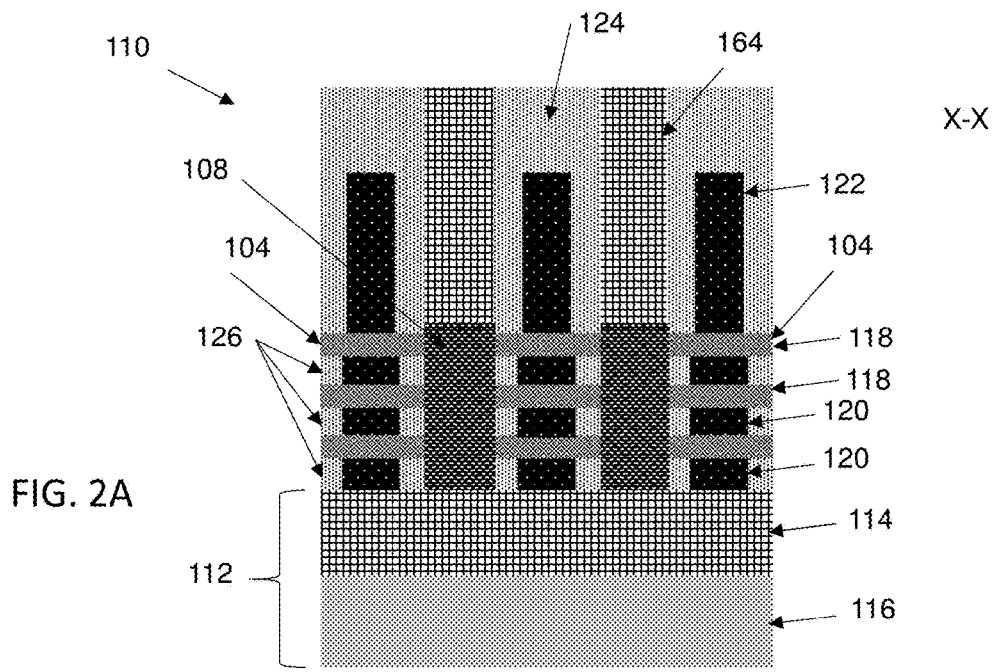
FIG. 2A shows a cross-sectional view, along line X-X in FIG. 1, of source/drain regions formed on a substrate, nanosheet stacks, and dummy gates in accordance with the present disclosure.
Figure 2B:
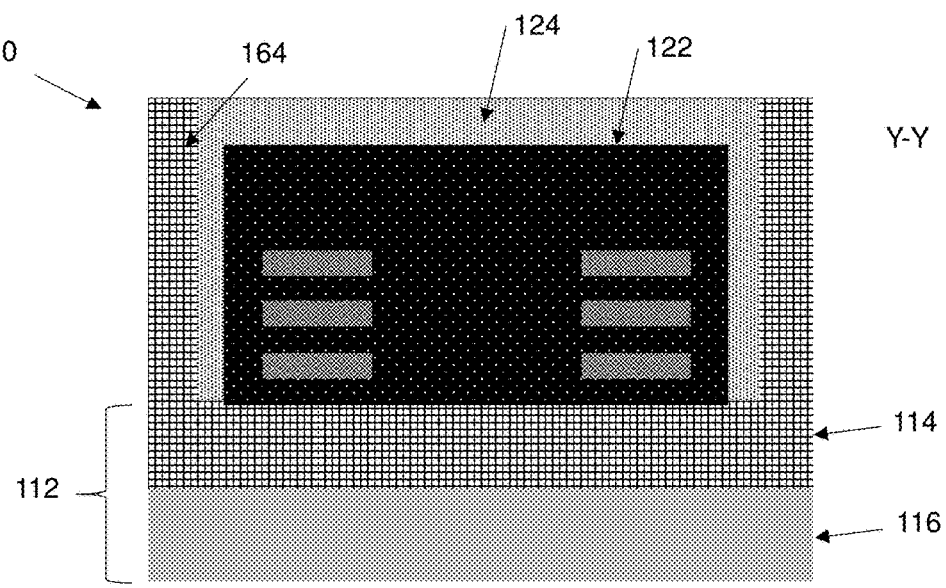
FIG. 2B shows a cross-sectional view, along line Y-Y in FIG. 1, of nanosheet stacks and dummy gates formed in accordance with the present disclosure.
Figure 2C:
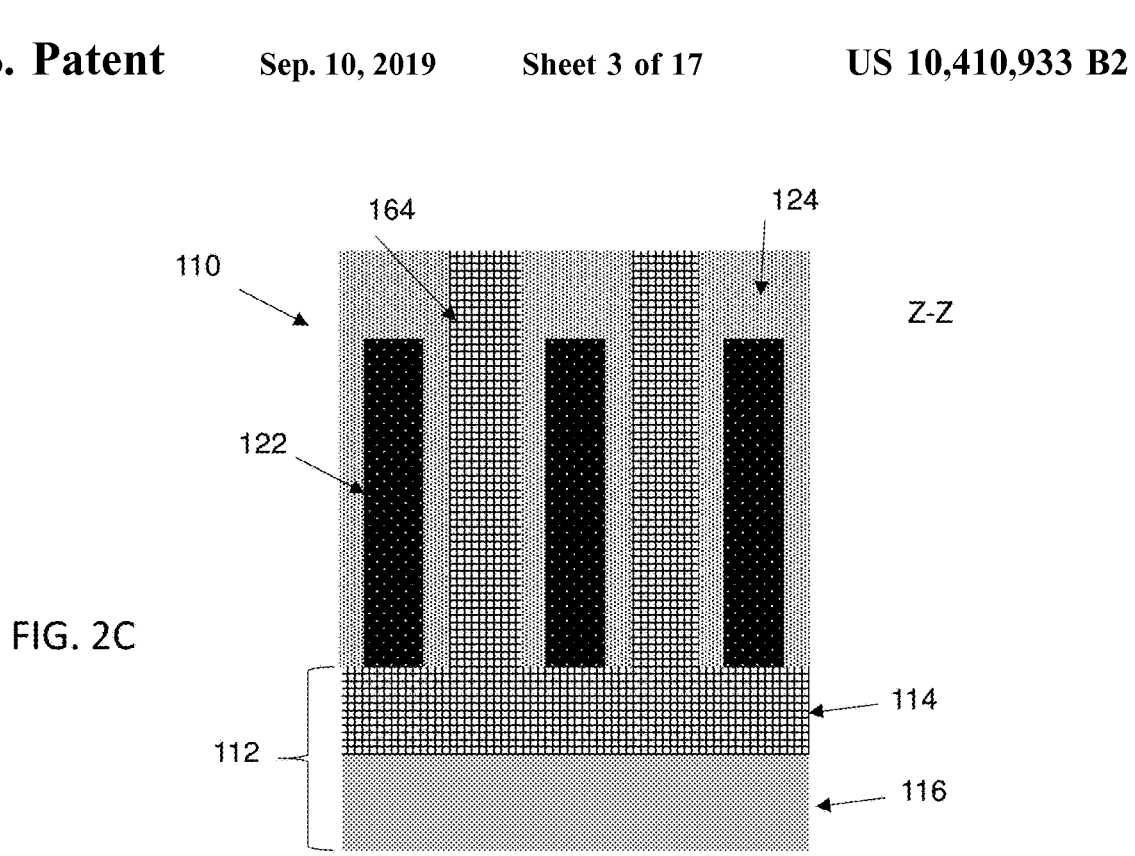
FIG. 2C shows a cross-sectional view, along line Z-Z in FIG. 1, of dummy gates formed in accordance with the present disclosure.

FIGS. 2A, 2B, and 2C each show a preexisting nanosheet device 110. Forming preexisting nanosheet device 110 may include forming source/drain regions 108 on a substrate 112. In one embodiment, source/drain regions 108 may be epitaxially grown from sidewalls of nanosheets 118. Substrate 112 shown in FIG. 2A includes a dielectric layer 114 disposed on a semiconductor layer 116. However, it should be understood that substrate 112 may include a silicon substrate, a silicon-on-insulator (SOI) substrate, or other substrate material without departing from the present disclosure. Forming preexisting nanosheet device 110 may also include forming a plurality of nanosheet stacks 104 extending between source/drain regions 108. Each of the plurality of nanosheet stacks 104 may include a plurality of alternating nanosheets 118 and sacrificial layers 120. A dummy gate 122 may be disposed on each of the nanosheet stacks 104. Dummy gate 122 may include a semiconductor material. In one embodiment, dummy gate 122 may include amorphous silicon (a-Si) disposed on a thin silicon dioxide ($SiO_2$) layer. In one embodiment, space between adjacent dummy gates 122 may be filled with a dielectric 164. In one embodiment, dielectric 164 may be formed by chemical vapor deposition (CVD), high-density plasma chemical vapor deposition (HDP-CVD), or a high-aspect ratio process (HARP). Dielectric 164 may include any interlevel or intralevel dielectric material including inorganic dielectric materials, organic dielectric materials, or combinations thereof. Suitable dielectric materials include carbon-doped silicon dioxide materials; fluorinated silicate glass (FSG); organic polymeric thermoset materials; silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied Materials). Examples of carbon-doped silicon dioxide materials, or organosilanes, include Black Diamond™ (available from Applied Materials) and Coral™ (available from Lam Research). An example of an HSQ material is FOx™ (available from Dow Corning). In one embodiment, dielectric 164 may include an oxide. In one embodiment, the present method may include planarization of dielectric 164.

Planarization of dielectric 164 may occur by chemical mechanical polishing (CMP). In a particular embodiment, planarization of dielectric 164 may occur by poly-open CMP (POC).

FIG. 2A shows a cross-section of preexisting nanosheet device 110 along line X-X in FIG. 1. FIG. 2B shows a cross-section of preexisting nanosheet device 110 along line Y-Y in FIG. 1. FIG. 2C shows a cross-section of preexisting nanosheet device 110 along line Z-Z in FIG. 1. These orientations carry through the drawings.

In one embodiment, sacrificial layers 120 may include silicon germanium (SiGe). Nanosheets 118 may include a semiconducting material including but not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity).

In one particular embodiment, nanosheets 118 may include silicon (Si). Nanosheet stacks 104 may include alternating layers of SiGe sacrificial layers 120 and Si nanosheets 118. Nanosheet stacks 104 may include at least one nanosheet 118. In one embodiment, nanosheet stacks 104 include three nanosheets 118. Substrate 112 may include a buried insulator layer 114 over a bulk semiconductor layer 116. Buried insulator layer 114 may include, for example, silicon oxide, and semiconductor layer 116 may include any semiconductor material listed for nanosheets 118.

FIGS. 2A, 2B, and 2C also show that forming preexisting nanosheet device 110 may include forming a plurality of raised source/drain (S/D) regions 108. A raised S/D region 108 may be formed adjacent to a nanosheet stack 104 such that nanosheets 118 extend between portions of an adjacent raised S/D region 108. S/D regions 108 are omitted from the plan view of FIG. 1 for clarity of the orientation of gates 106 and nanosheets 118 in the various cross-sections. It should be understood that nanosheets 118 may not extend through S/D regions 108. In one embodiment, nanosheets 118 extend between adjacent S/D regions 108 and do not extend through S/D regions 108. In one embodiment, S/D regions 108 may be epitaxially grown. The terms "epitaxial growth" and "epitaxially formed and/or grown" mean the growth of a semiconductor material on a deposition surface of a semiconductor material, in which the semiconductor material being grown may have the same crystalline characteristics as the semiconductor material of the deposition surface. In an epitaxial growth process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material may have the same crystalline characteristics as the deposition surface on which it may be formed. For example, an epitaxial semiconductor material deposited on a {100} crystal surface may take on a {100} orientation. In some embodiments, epitaxial growth processes may be selective to forming on semiconductor surfaces, and may not deposit material on dielectric surfaces, such as silicon dioxide or silicon nitride surfaces.

In one particular embodiment, S/D regions 108 may be formed by epitaxially growing heavily doped silicon (Si) or silicon germanium (SiGe).

Gate hard mask 124 may be formed over dummy gates 122 using any now known or later developed techniques, e.g., deposition of silicon nitride (SiN). For example, in one embodiment, gate hard mask 124 may include a material such as SiN, deposited on dummy gate 122. In such an embodiment, offset spacers 126 may be formed by removing a portion of sacrificial layers 120 selective to nanosheets 118, and depositing SiN to replace the removed portions of sacrificial layers 120. It should be understood that gate hard mask 124 and offset spacers 126 may include different materials. For example, in one embodiment gate hard mask 124 may include SiN and offset spacers 126 may include SiBCN (silicon borocarbonitride). Formation of offset spacers 126 may include a spacer pull-down formation process, sidewall image transfer (SIT), atomic layer deposition (ALD), reactive ion etching (RIE), or any other now known or later developed techniques for forming offset spacers 126. In one embodiment, after offset spacers 126 are formed, source/drain regions 108 may be epitaxially grown from sidewalls of nanosheets 118.

Figure 3A:
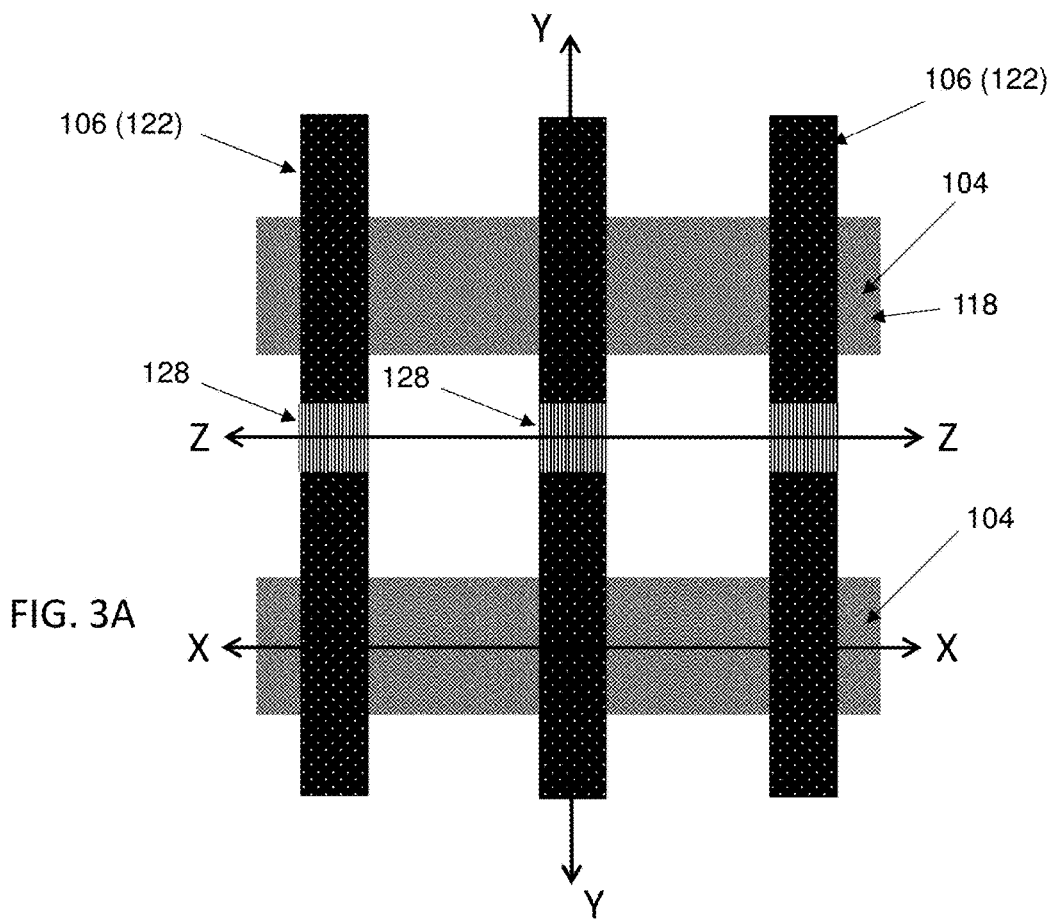
FIG. 3A shows a plan view of dummy gates, gate cut isolation regions, and nanosheets in accordance with the present disclosure.
Figure 3B:
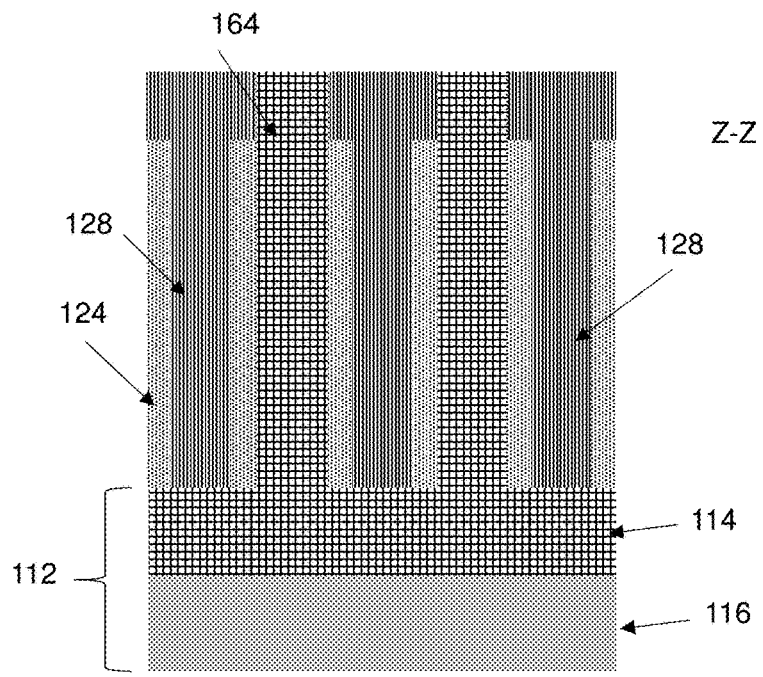
FIG. 3B shows a cross-sectional view, along line Z-Z in FIG. 3A, of forming the gate cut isolation regions in accordance with the present disclosure.
Figure 3C:
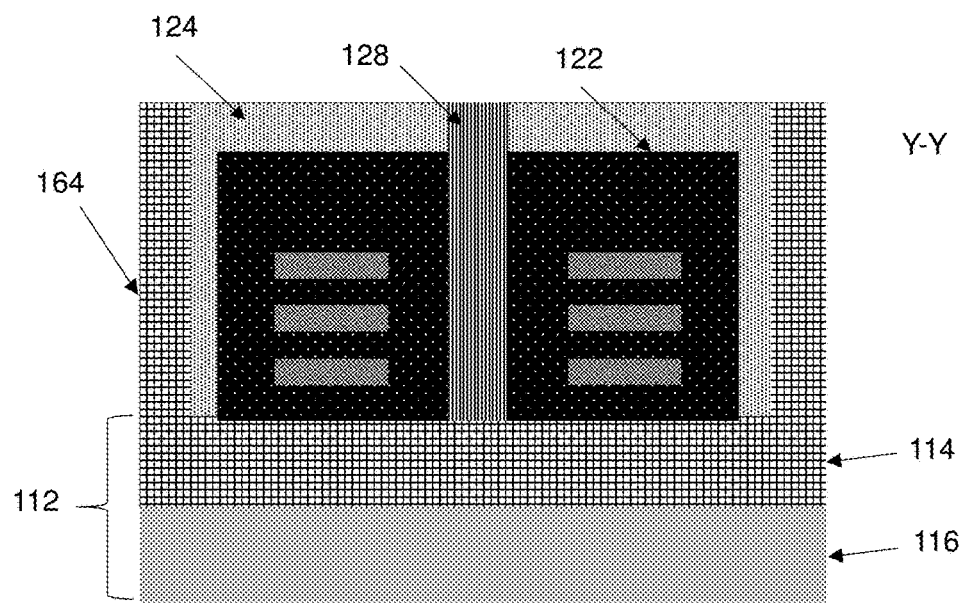
FIG. 3C shows a cross-sectional view, along line Y-Y in FIG. 3A, of forming the gate cut isolation regions in accordance with the present disclosure.

FIG. 3A shows a plan view of dummy gates 122, nanosheets 118, and a plurality of gate cut isolation regions 128. FIG. 3B shows a cross section of FIG. 3A along line Z-Z, and FIG. 3C shows a cross section of FIG. 3A along line Y-Y. As shown clearly in FIG. 3C, a portion of each of the dummy gates 122 may be removed at a location between nanosheet stacks 104 and replaced with a gate cut isolation region 128. In one embodiment, the dummy gates are cut by etching through gate hard mask 124 and dummy gate 122 selective to substrate 112. In one embodiment, cutting dummy gate 122 includes applying a mask (not shown) to gate hard mask 124 and removing material from dummy gate 122 using a plasma etch, reactive ion etch, or other anisotropic etch process. Gate cut isolation regions 128 may be deposited to replace the material removed from dummy gate 122. In one embodiment, gate cut isolation regions 128 include a nitride material. In one particular embodiment, gate cut isolation regions 128 include silicon nitride.

Figure 4:
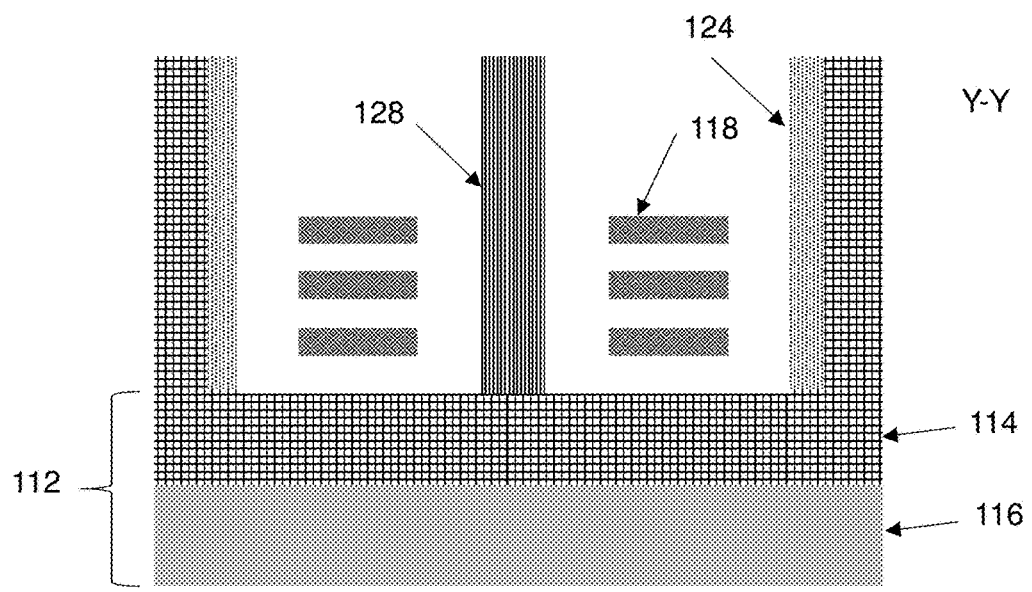
FIG. 4 shows a cross-sectional view, along line Y-Y in FIG. 1, of removing the dummy gates in accordance with the present disclosure.

FIG. 4 shows a process of removing dummy gate 122. The removal of dummy gate 122 may include removing layers of dielectric and gate hard mask 124 above dummy gate 122 (shown in FIGS. 3A and 3B) by chemical mechanical polishing (CMP). Removal of dummy gate 122 may also include an isotropic etch selective to substrate 112, nanosheets 118, and gate cut isolation regions 128. In one embodiment, removal of dummy gate 122 may include removing the a-Si selective to $SiO_2$ followed by a brief $SiO_2$ removal to expose nanosheets 118. In one embodiment, the a-Si may be removed selective to $SiO_2$ by a wet hot ammonia etch, or a tetramethylammonium hydroxide (TMAH) wet etch. The thin $SiO_2$ layer may be removed by a dilute hydrofluoric acid (DHF) etch.

Figure 5:
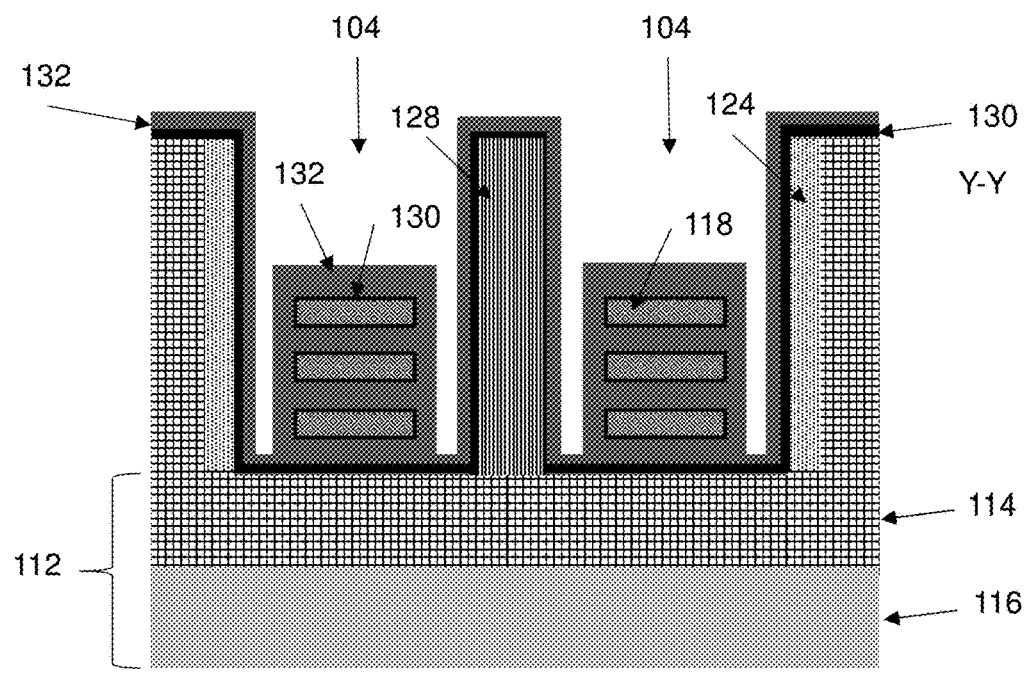
FIG. 5 shows a cross-sectional view, along line Y-Y in FIG. 1, of depositing a high-k dielectric layer and first work function metal in accordance with the present disclosure.

FIG. 5 shows a process of depositing a high-k dielectric layer 130 and first work function metal 132. High-k metal layer 130 may be deposited on nanosheets 118 by atomic layer deposition (ALD), thermal atomic layer deposition, or any other similar process now known or later developed for depositing a high-k dielectric. In one embodiment, high-k layer 130 may be deposited on nanosheets 118 such that high-k layer 130 completely surrounds each nanosheet 118. In one embodiment, high-k layer 130 may be deposited on nanosheets 118, substrate 112, gate hard mask 124, and gate cut isolation regions 128. In one embodiment, high-k layer 130 may be thin such that high-k layer 130 does not pinch off space between nanosheets 118. First work function metal 132 may be deposited over high-k layer 130 such that first work function metal 132 completely surrounds each nanosheet 118 in the nanosheet stacks 104. In one embodiment, first work function metal 132 over first nanosheet stack 134 may be connected to first work function metal 132 over second nanosheet stack 136 only by a portion of first work function metal 132 formed around isolation region 128. In one embodiment, first work function metal 132 may completely fill any remaining space between individual nanosheets 118 of each nanosheet stack 104.

Figure 6:
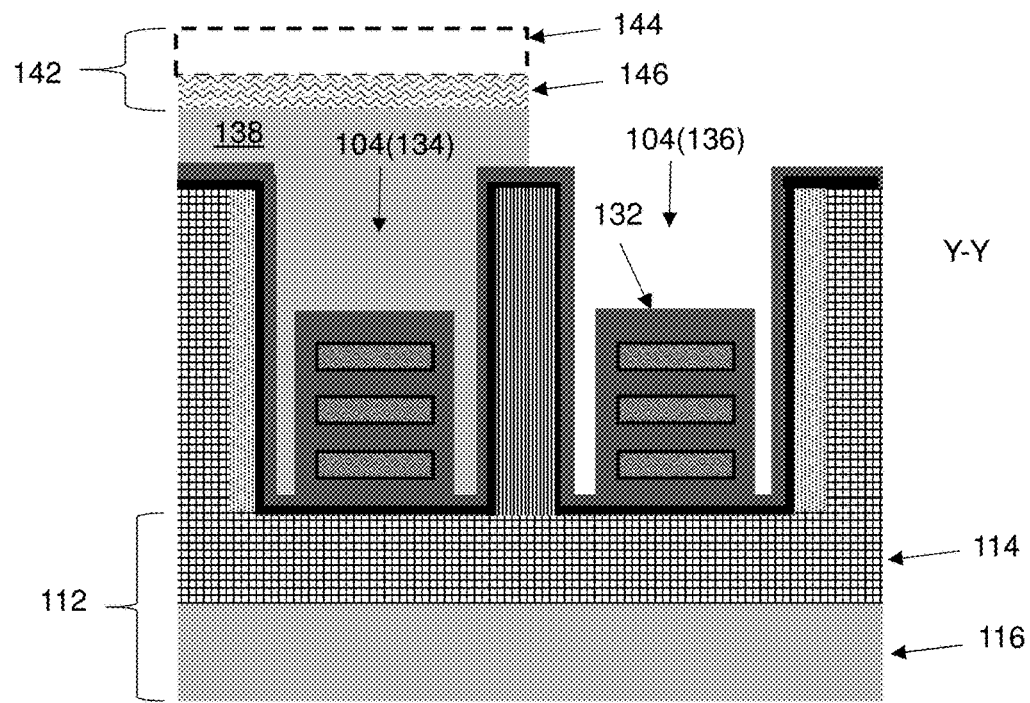
FIG. 6 shows a cross-sectional view, along line Y-Y in FIG. 1, of masking off a first nanosheet stack in accordance with the present disclosure.

FIG. 6 shows a process of masking off a first nanosheet stack 134 and exposing a second nanosheet stack 136. Masking off first nanosheet stack 134 may include depositing an organic planarization layer (OPL) 138 or other soft mask material over first nanosheet stack 134 and second nanosheet stack 136, and patterning a mask 142 over the first nanosheet stack 134. Mask 142 may include a photoresist material 144 and an antireflective coating 146 between photoresist material 144 and OPL 138. Antireflective coating 146 may include silicon containing antireflective coating (SiARC) or other antireflective coating (ARC) material such as TiARC, TiOx, SiON, etc. In one embodiment, forming mask 142 includes depositing antireflective coating 146 over OPL 138, and then depositing photoresist material 144 over antireflective coating 146. Photoresist material 144 may be removed from antireflective coating 146 over second nanosheet stack 136 by a lithography process. Antireflective coating 146 and OPL 138 over second nanosheet stack 136 may be removed by a reactive ion etch (RIE) process to expose first work function metal 132 over second nanosheet stack 136. During the RIE process, photoresist material 144 may be removed from over first nanosheet stack 134.

The exposing of second nanosheet stack 136 may include an anisotropic etch of photoresist layer 144 and exposed OPL 138 selective to first work function metal 132. The anisotropic etch may include reactive a reactive ion etch (RIE), or any other suitable anisotropic etch process now known or later developed. As a result, in the embodiment shown in FIG. 6, first nanosheet stack 134 may be masked off with antireflective coating 146 remaining on OPL 138 over first nanosheet stack 134, and first work function metal 132 on second nanosheet stack 136 may be exposed. In one embodiment, antireflective coating 146 may then be removed by an etchant selective to OPL 138 and first work function metal 132. As shown in FIG. 6, OPL 138 may cover first work function metal 132 over first nanosheet stack 134 and a portion of first work function metal 132 around isolation region 128.

Figure 7:
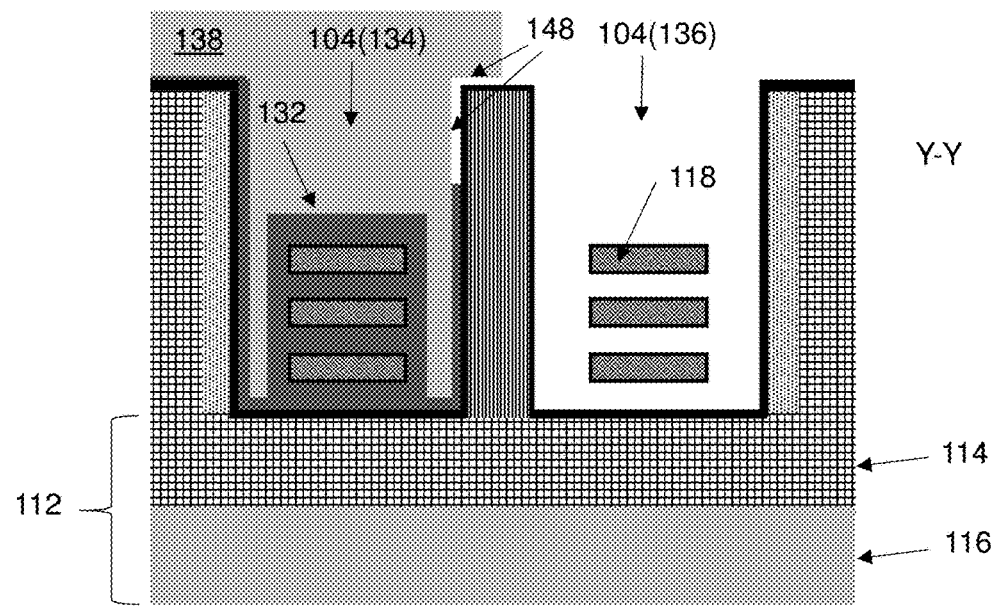
FIG. 7 shows a cross-sectional view, along line Y-Y in FIG. 1, of removing a portion of the first work function metal from the second nanosheet stack in accordance with the present disclosure.

FIG. 7 shows a cross-sectional view of a process including removing a portion of first work function metal 132 from second nanosheet stack 136. First work function metal 132 may be removed from second nanosheet stack 136 by an isotropic etch. An isotropic etch may be required to remove first work function metal 132 from between nanosheets 118 of second nanosheet stack 136. Isotropically etching first work function metal 132 from between nanosheets 118 of second nanosheet stack 136 may also remove a fraction of first work function metal 132 masked off by OPL 138, creating an undercut 148. Undercut 148, as shown in FIG. 7, may be acceptable because undercut 148 does not intersect with nanosheets 118 of first nanosheet stack 134. Consequently, nanosheets 118 of first nanosheet stack 134 may remain completely surrounded by first work function metal 132.

Figure 8:
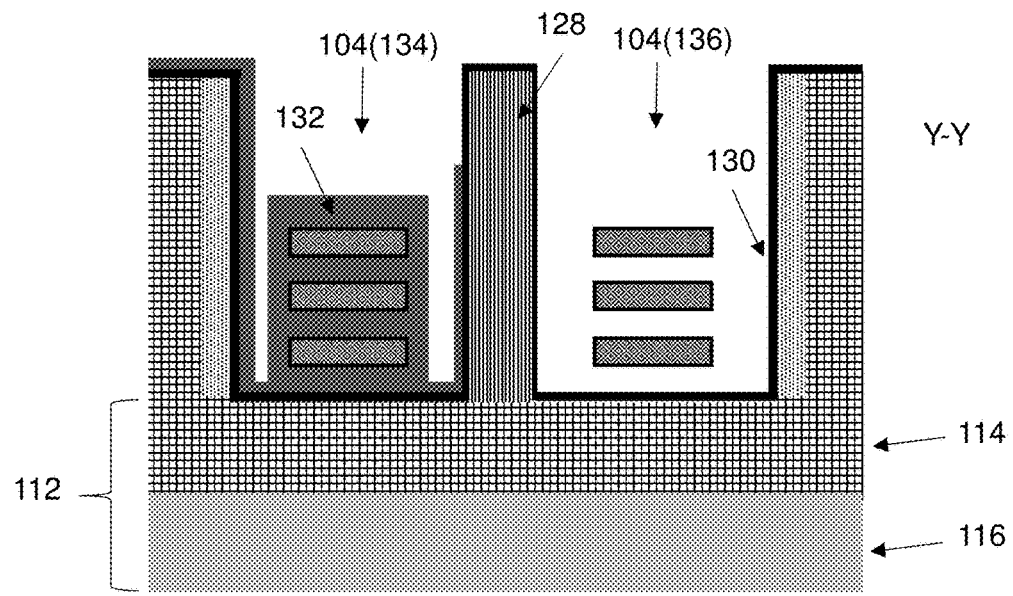
FIG. 8 shows a cross-sectional view, along line Y-Y in FIG. 1, of removing the mask from the first nanosheet stack in accordance with the present disclosure.

FIG. 8 shows a cross sectional view of a process of removing OPL 138 from first nanosheet stack 134. OPL 138 may be removed by an etchant selective to first work function metal 132 and high-k layer 130. At this point, as shown in FIG. 8, first work function metal 132 may remain on first nanosheet stack 134, and there may be no work function metal on second nanosheet stack 136.

Figure 9A:
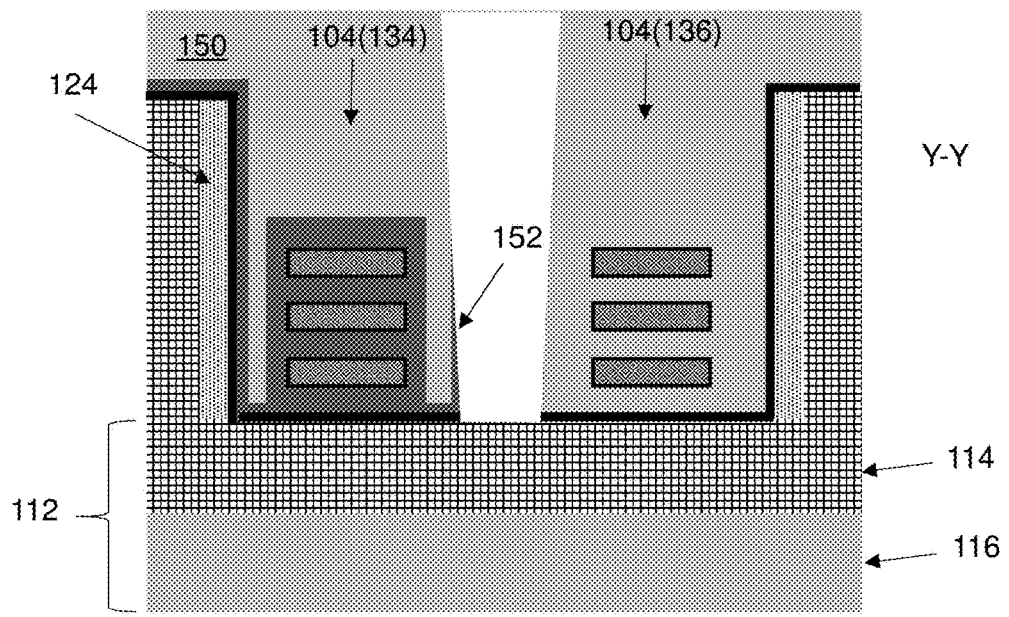
FIG. 9A shows a cross-sectional view, along line Y-Y in FIG. 1, of removing the gate cut isolation regions in accordance with the present disclosure.
Figure 9B:
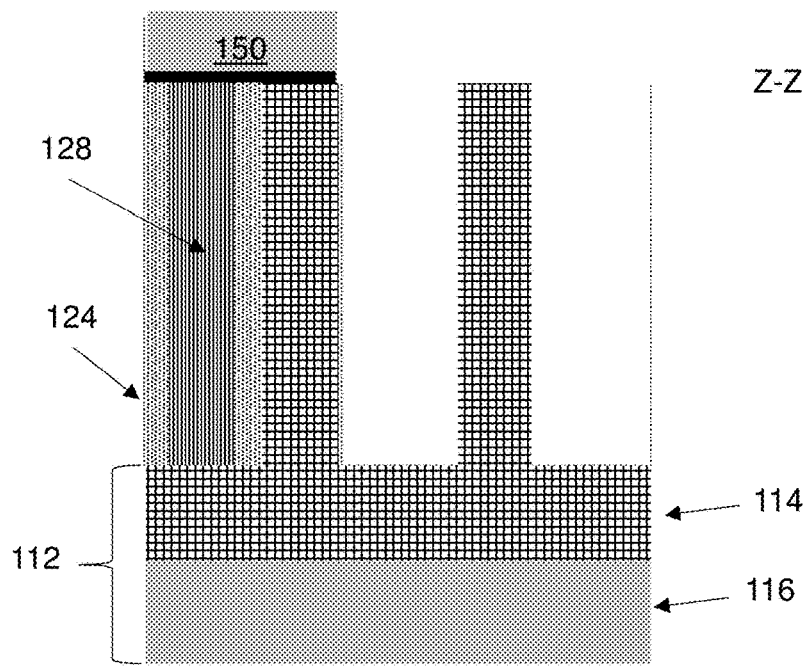
FIG. 9B shows a cross-sectional view, along line Z-Z in FIG. 1, of removing the gate cut isolation regions in accordance with the present disclosure.

FIGS. 9A and 9B show cross sectional views of a process of removing gate cut isolation regions 128 along lines Y-Y and Z-Z of FIG. 1, respectively. This process may include lithographic patterning and etch processes. As shown clearly in FIG. 9A, a second OPL 150 can be deposited over the nanosheet stacks 104. In one embodiment, second OPL 150 can be deposited up to at least the height of gate cut isolation regions 128. In one embodiment, a second antireflective coating and photoresist layer may be deposited on second OPL 150 (not shown) and patterned using a lithographic patterning and etch process to remove gate cut isolation regions 128 at locations where gate 106 will be reconnected. Gate cut isolation regions 128 may then be removed by etching gate cut isolation regions 128 selective to oxide. In an embodiment where gate cut isolation regions 128 include nitride, an etchant that removes gate cut isolation regions 128 may also remove gate hard mask 124, as shown clearly in FIG. 9B. Returning to FIG. 9A, the removal of gate cut isolation regions 128 may leave a pillar 152 of first work function metal 132 between first nanosheet stack 134 and second nanosheet stack 136. In one embodiment, second OPL 150 may be removed (not shown) with an etchant selective to first work function metal 132 and high-k layer 130.

Figure 10A:
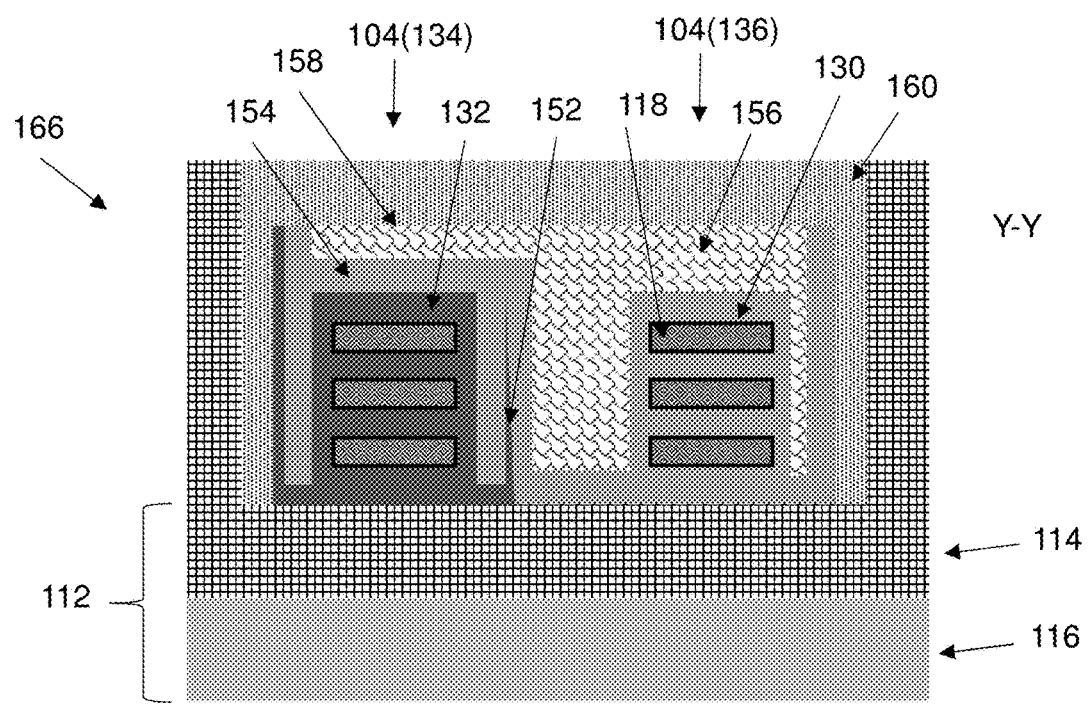
FIG. 10A shows a cross-sectional view, along line Y-Y in FIG. 1, of depositing a second work function metal in accordance with the present disclosure.
Figure 10B:
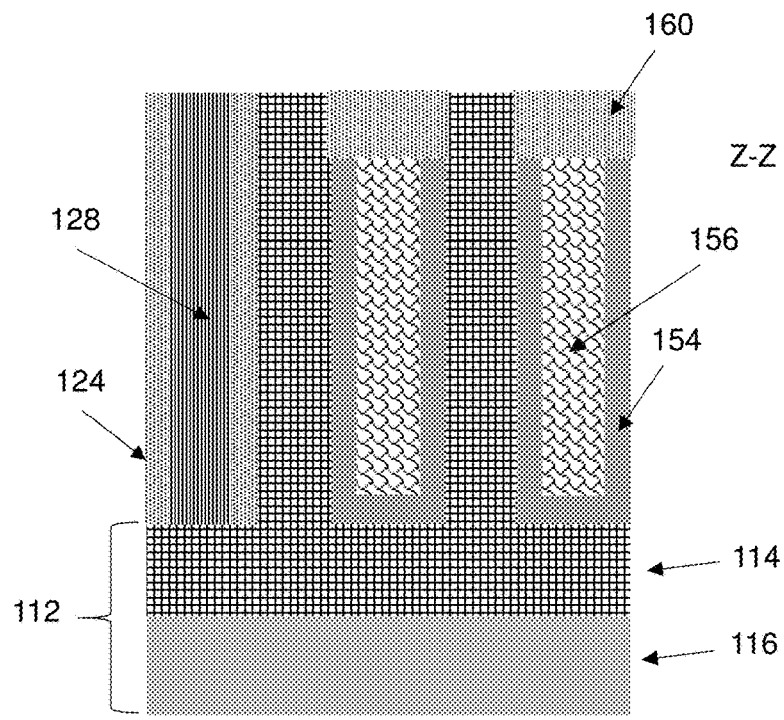
FIG. 10B shows a cross-sectional view, along line Z-Z in FIG. 1, of depositing a second work function metal in accordance with the present disclosure.

FIGS. 10A and 10B show cross sectional views of a process of depositing a second work function metal 154 over first work function metal 132, and second nanosheet stack 136 along lines Y-Y and Z-Z, respectively. Second work function metal 154 may be deposited over exposed high-k layer 130 such that second work function metal 154 completely surrounds each nanosheet 118 in the second nanosheet stack 136. In one embodiment, second work function metal 154 may completely fill any remaining space between individual nanosheets 118 of second nanosheet stack 136. As shown clearly in FIG. 10A, second work function metal 154 may be deposited on either side of pillar 152 of first work function metal 132. In FIGS. 3A-3C, gates 106 were cut to deposit gate cut isolation regions 128. However, IC design may contemplate reconnecting of at least some gates 106. In one embodiment, gate metal 156 may be deposited over second work function metal 154. Gate metal 156 may include tungsten (W), ruthenium (Ru), cobalt (Co), copper (Cu), or aluminum (Al). Gate metal 156 may reconnect gates 106 upon being formed. A CMP process followed by gate metal recess process may be used to level an upper surface 158 before a dielectric cap 160 can be deposited over gate metal 156. In one embodiment, dielectric cap 160 may include a nitride. In one embodiment, dielectric cap 160 may include silicon nitride (SiN), silicon-borocarbonitride (SiBCN), silicon oxycarbide (SiCO), or silicon oxycarbonitride (SiOCN). In one particular embodiment, dielectric cap 160 may include silicon nitride.

Figure 11:
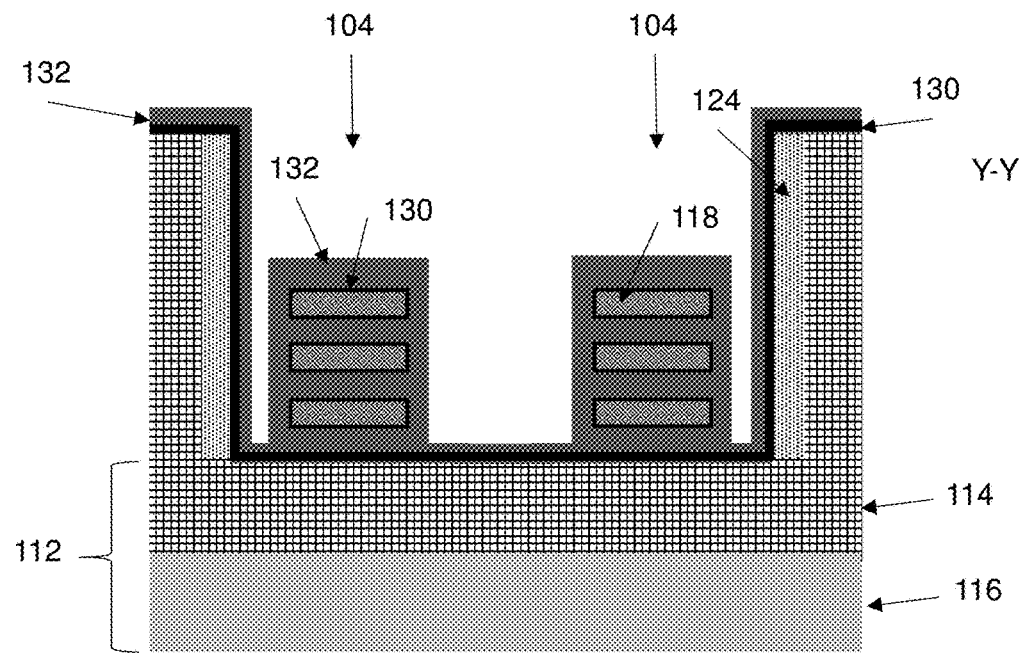
FIG. 11 shows a cross-sectional view, along line Y-Y in FIG. 1, of depositing a high-k dielectric layer and a first work function metal on the nanosheet stacks in accordance with a further embodiment of the present disclosure.

FIG. 11 shows a further embodiment of the present disclosure. FIG. 11 shows a cross sectional view of a process of depositing high-k layer 130 and first work function metal 132 similarly as described above regarding FIG. 5. However, in this embodiment, the deposition of high-k layer 130 and first work function metal 132 occurs after removing dummy gate 122 and prior to forming gate cut isolation regions 128. In other words, first the dummy gates 122 and nanosheet stacks 104 are formed as described above and shown in FIGS. 2A-2C. Subsequently dummy gates 122 are removed and high-k layer 130, and first work function metal 132 are deposited similarly as described above.

Figure 12:
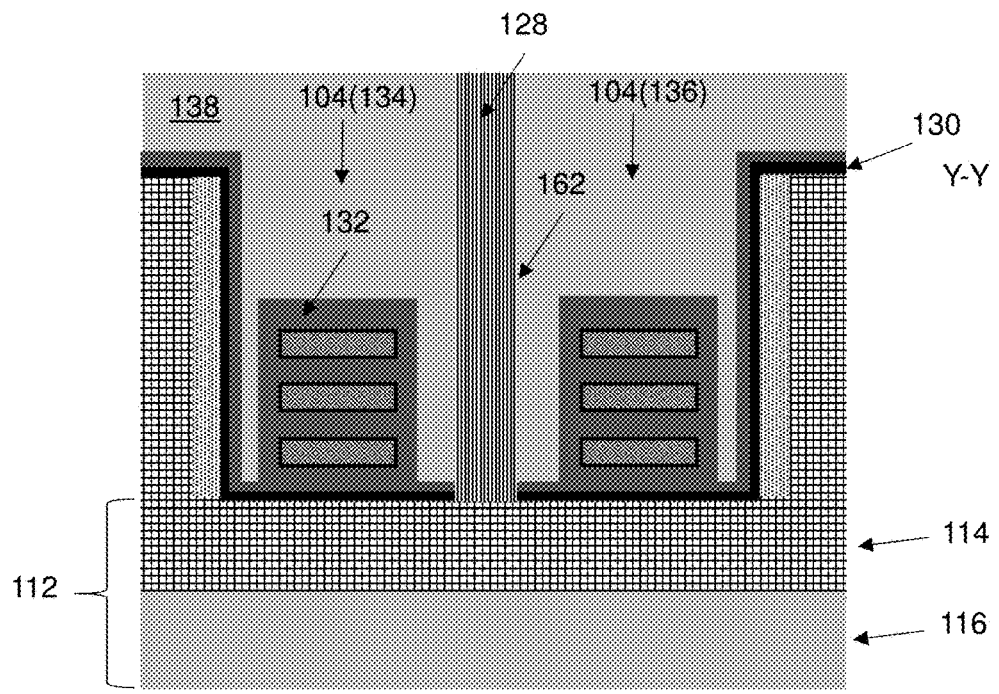
FIG. 12 shows a cross-sectional view, along line Y-Y in FIG. 1, of removing a portion of the gate and forming a gate cut isolation region in accordance with a further embodiment of the present disclosure.

FIG. 12 shows a process of the embodiment beginning at FIG. 11 including forming gate cut isolation regions 128. Here, OPL 138 may be deposited over the nanosheet stacks 104. In this embodiment, an opening 162 (shown filled) may be formed between each of the nanosheet stacks 104. Opening 162 may be formed by masking (not shown) OPL 138 and using an anisotropic etch to remove a portion of OPL 138. In one embodiment, forming opening 162 includes etching through first work function metal 132 and high-k layer 130 to substrate 112, disconnecting first work function metal 132 over first nanosheet stack 134 from first work function metal 132 over second nanosheet stack 136. In one embodiment, forming opening 162 includes etching though first work function metal 132 to expose high-k layer 130. As shown, gate cut isolation regions 128 may be deposited in opening 162. Isolation region 128 may cover a cross-section of a portion of first work function metal 132 that may be between nanosheet stacks 104 and connected to first work function metal 132 over first nanosheet stack 134. In one embodiment, the deposition of gate cut isolation regions 128 may be followed by an etch-back process to reveal OPL 138.

Figure 13:
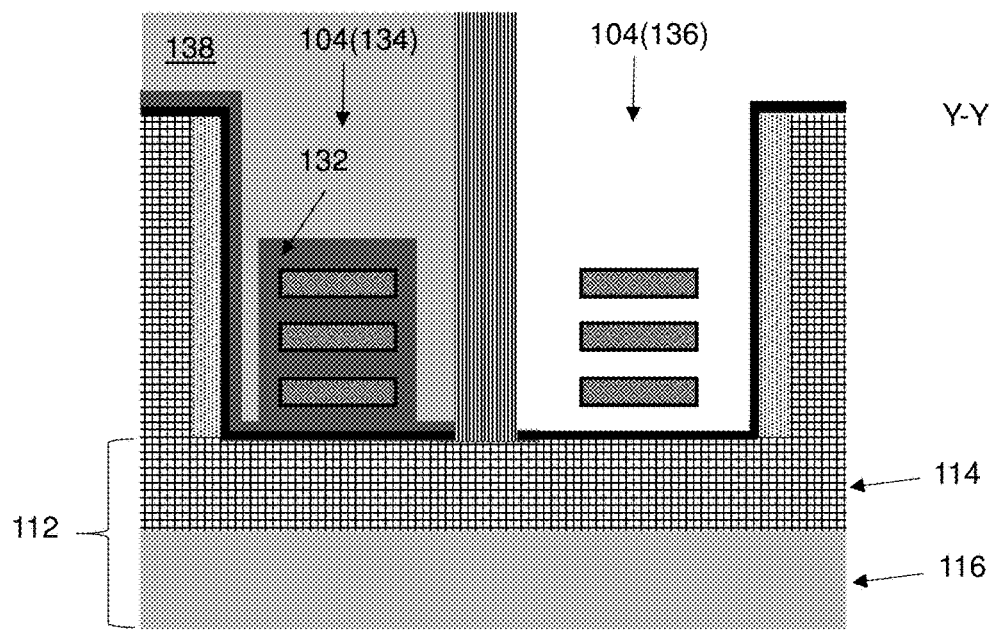
FIG. 13 shows a cross-sectional view, along line Y-Y in FIG. 1, of removing a portion of the first work function metal from the second nanosheet stack in accordance with a further embodiment of the present disclosure.

FIG. 13 shows a process of the embodiment beginning at FIG. 11 including removing first work function metal 132 from second nanosheet stack 136. This process may be partially similar to masking off first nanosheet stack 134 and exposing second nanosheet stack 136 described above regarding FIG. 6 and is not shown again or reiterated here for brevity. FIG. 13 shows the result of such a process, as well as the removal of first work function metal 132 from second nanosheet stack 136. Similarly as described above regarding FIG. 7, an isotropic etch may be used to remove first work function metal 132 from second nanosheet stack 136. In this embodiment however, the isotropic etch does not create an undercut (e.g., undercut 148 shown in FIG. 7). This is because gate cut isolation regions 128 in this embodiment disconnect first work function metal 132 on first nanosheet stack 134 from first work function metal 132 on second nanosheet stack 136 (shown clearly in FIG. 12).

Figure 14:
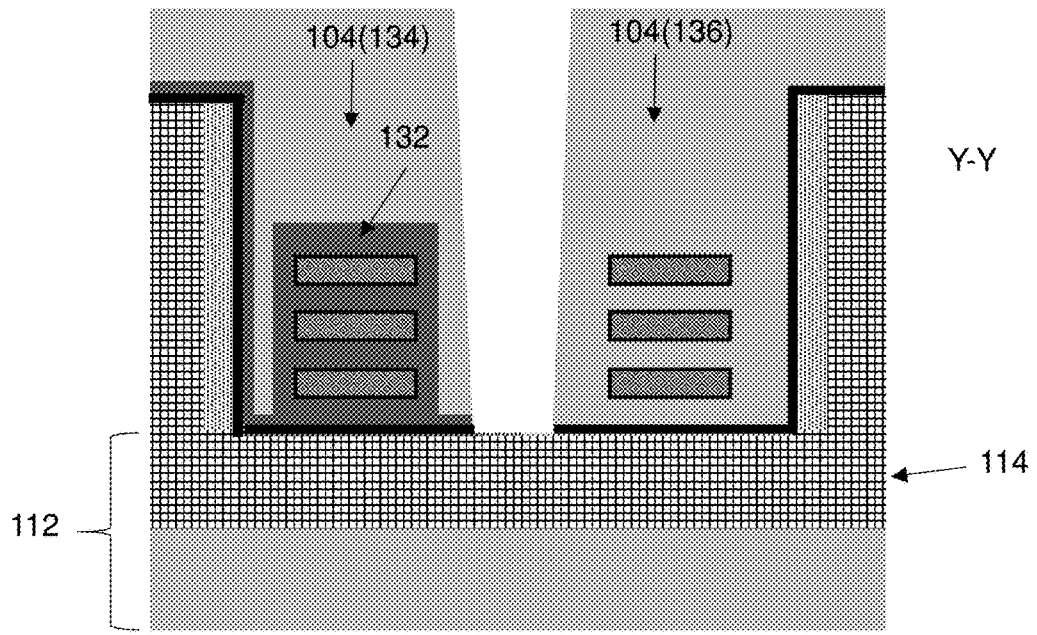
FIG. 14 shows a cross-sectional view, along line Y-Y in FIG. 1, of removing the gate cut isolation region in accordance with a further embodiment of the present disclosure.

FIG. 14 shows a process of the embodiment beginning at FIG. 11 including removing gate cut isolation regions 128. This process may be substantially similar to removing gate cut isolation regions 128 described above regarding FIG. 9A and is not reiterated here for brevity. The difference between FIG. 9A and FIG. 14 may be that after the gate cut isolation region removal in this alternate embodiment shown in FIG. 14, no pillar 152 of first work function metal 132 may be left behind. (Pillar 152 shown clearly in FIG. 9A). Pillar 152 may be absent in this embodiment because gate cut isolation regions 128 may be deposited after first work function metal 132 and no first work function metal 132 was formed on gate cut isolation regions 128 (shown in FIG. 12).

Figure 15:
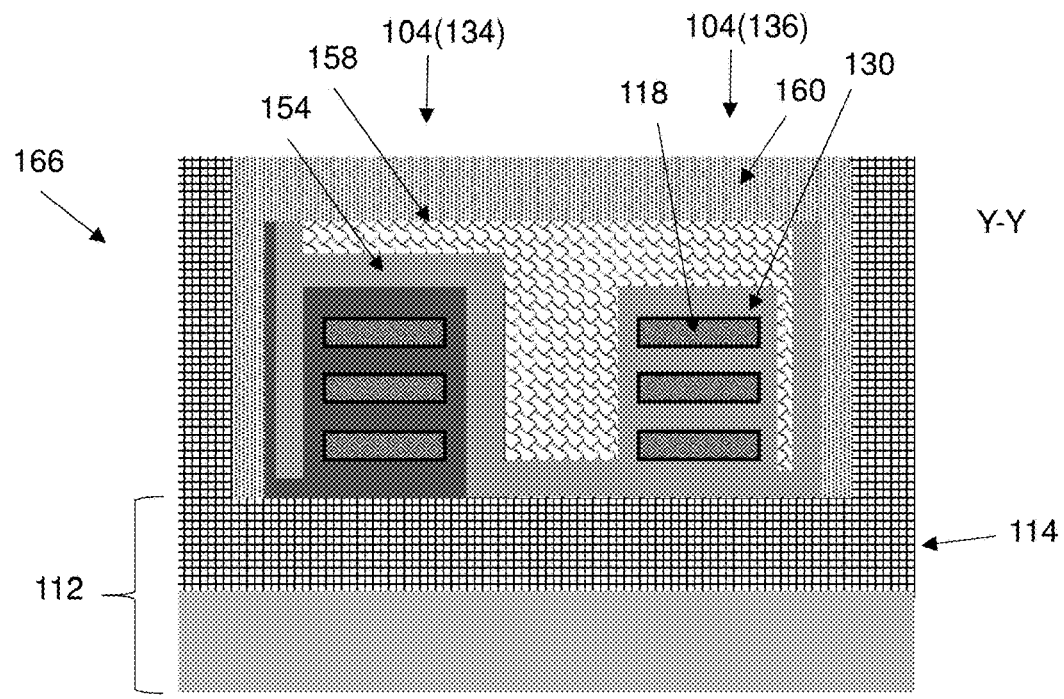
FIG. 15 shows a cross-sectional view, along line Y-Y in FIG. 1, of depositing a second work function metal in accordance with a further embodiment of the present disclosure.

FIG. 15 shows a process of the embodiment beginning at FIG. 11 including depositing second work function metal 154 and gate metal 156. This process may be substantially similar to the process of depositing second work function metal 154 as described above regarding FIG. 10A and is not reiterated here for brevity. One difference between FIG. 10A and FIG. 15 may be that pillar 152 remains absent in FIG. 15. As such, second work function metal 154 may be deposited on first work function metal 132 that may be covering first nanosheet stack 134, on high-k layer 130 that may be covering nanosheets 118 of second nanosheet stack 136, and not on pillar 152. (Pillar 152 shown clearly in FIG. 10A).

Figure 16:
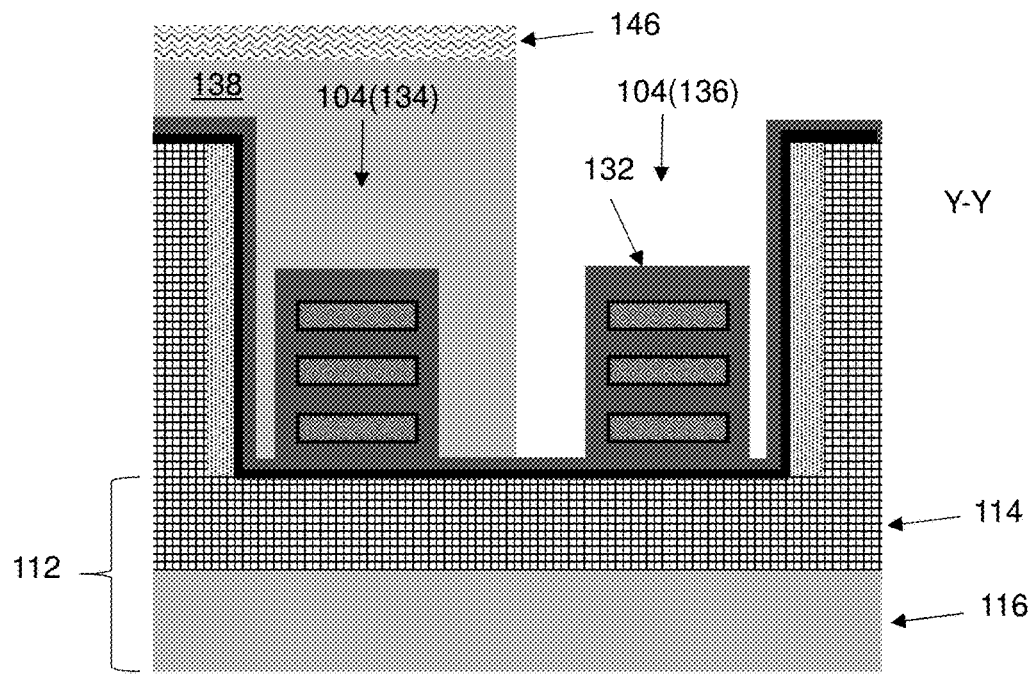
FIG. 16 shows a cross-sectional view, along line Y-Y in FIG. 1, of masking off a first nanosheet stack in accordance with a further embodiment of the present disclosure.

FIG. 16 shows a further embodiment of the present disclosure. FIG. 16 shows a cross section view of a process similar to FIG. 11 described above. In this embodiment, first nanosheet stack 134 and second nanosheet stack 136 are formed on substrate 112 similarly as described above. First work function metal 132 may be deposited on nanosheet stacks 104 similarly as described above regarding FIG. 5. However, in this embodiment, the deposition of high-k layer 130 and first work function metal occurs without forming any gate cut isolation regions 128. As shown in FIG. 16, a mask may be formed over first nanosheet stack 134 and a portion of first work function metal 132 between first nanosheet stack 134 and second nanosheet stack 136. Similarly as described above regarding FIGS. 12 and 13, an OPL layer 138 and optional antireflective coating 146 may be deposited over first nanosheet stack 134 and second nanosheet stack 136 (not shown), and etched such that first nanosheet stack 134 is masked and second nanosheet stack 136 is exposed, as shown in FIG. 16.

Figure 17:
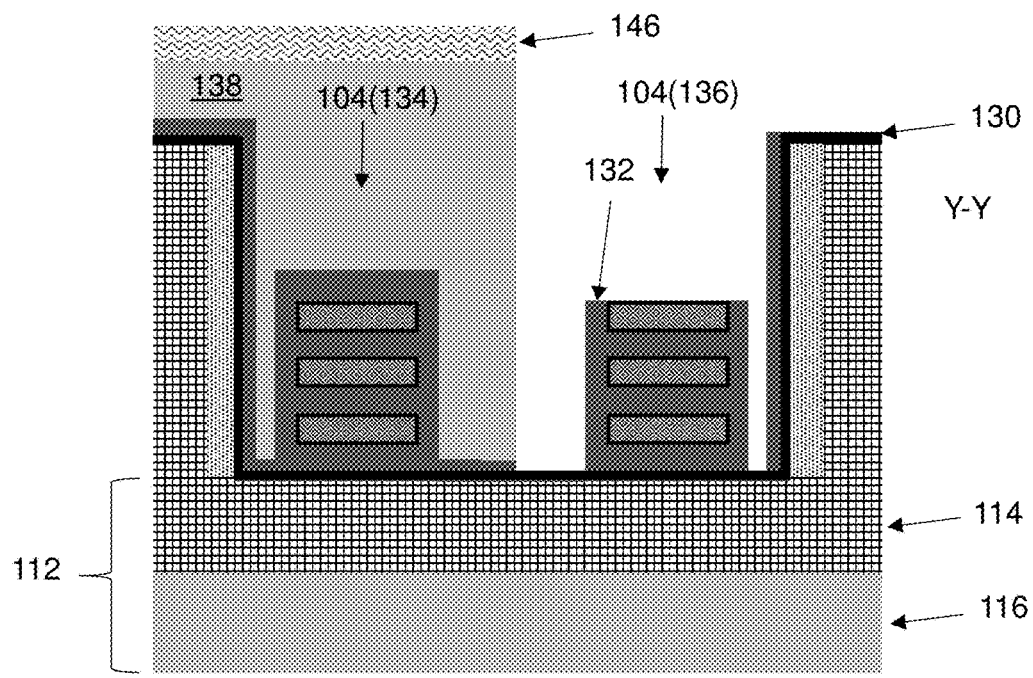
FIG. 17 shows a cross-sectional view, along line Y-Y in FIG. 1, of a directional etch in accordance with a further embodiment of the present disclosure.

FIG. 17 shows a process of the embodiment beginning at FIG. 16 including directionally etching the exposed portion of first work function metal 132. In one embodiment, the exposed portion of first work function metal 132 may be etched using an anisotropic or dry etch process such as a reactive ion etch (RIE) process, or any other now known or later developed anisotropic dry etch process. As shown in FIG. 17, the exposed portion of first work function metal 132 may be etched selective to high-k layer 130, exposing high-k layer 130. The anisotropic etch process may disconnect first work function metal 132 formed over first nanosheet stack 134 from first work function metal 132 formed over second nanosheet stack 136. It should be understood that opening 162 shown in the embodiment described above regarding FIGS. 12 and 13 may not be included in the embodiment shown in FIGS. 16-23.

Figure 18:
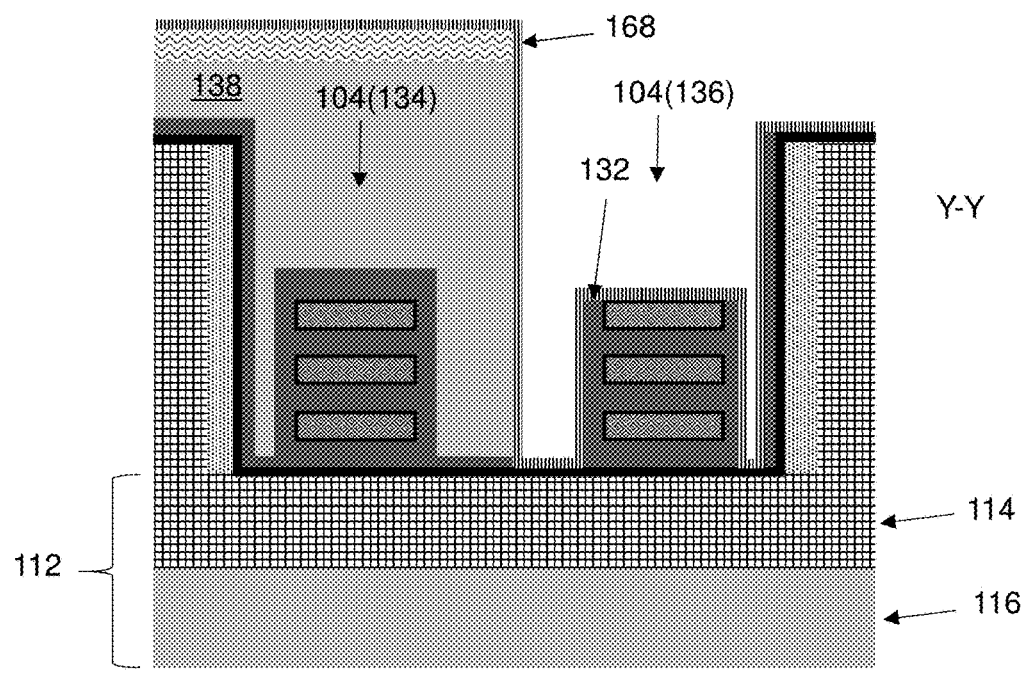
FIG. 18 shows a cross-sectional view, along line Y-Y in FIG. 1, of forming an isolation region in accordance with a further embodiment of the present disclosure.
Figure 19:
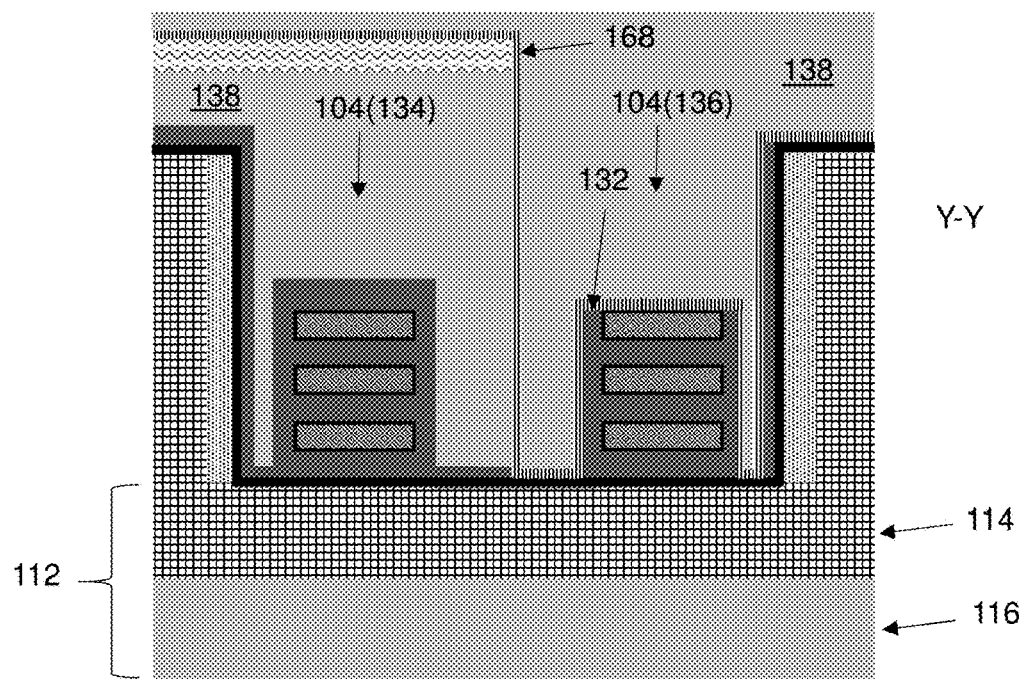
FIG. 19 shows a cross-sectional view, along line Y-Y in FIG. 1, of masking off the second nanosheet stack in accordance with a further embodiment of the present disclosure.

FIG. 18 shows a process of the embodiment beginning at FIG. 16 including forming isolation region 168. As shown in FIG. 18, in this embodiment isolation region 168 may be a conformal dielectric layer formed over nanosheet stacks 104. In one embodiment, isolation region 168 may include a dielectric material such as silicon nitride. In one embodiment, isolation region 168 may be formed by chemical vapor deposition (CVD), high-density plasma chemical vapor deposition (HDP-CVD), or a high-aspect ratio process (HARP). In one embodiment, isolation region 168 may be deposited such that isolation region 168 separates first work function metal 132 on first nanosheet stack 134 from first work function metal 132 on second nanosheet stack 136. In this embodiment, isolation region 168 may be formed to a height above an exposed cross-section of first work function metal 132 underneath OPL 138. Isolation region 168 may then be covered with OPL 138, and shown in FIG. 19.

Figure 20:
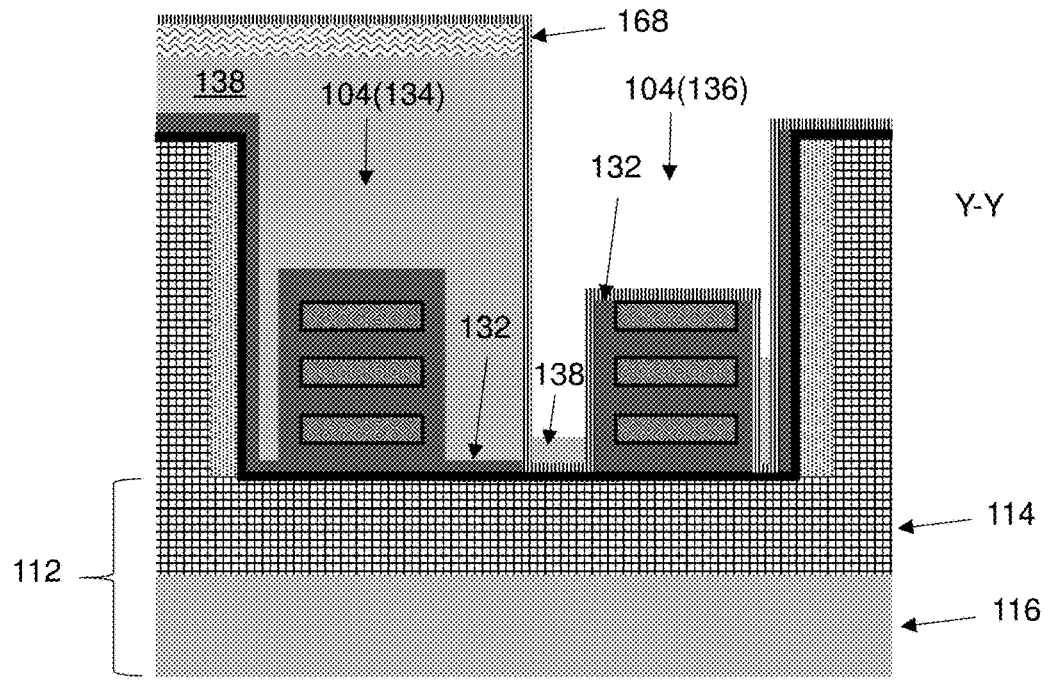
FIG. 20 shows a cross-sectional view, along line Y-Y in FIG. 1, of removing the mask from the second nanosheet stack in accordance with a further embodiment of the present disclosure.

FIG. 20 shows a process of the embodiment beginning at FIG. 16 including removing a portion of OPL 138. In one embodiment, OPL 138 may be etched selective to isolation region 168 and controlled such that OPL 138 may not be completely removed between nanosheet stacks 104. In one embodiment, a portion of OPL 138 may remain between nanosheet stacks 104 above a depth of first work function metal 132 that extends between nanosheet stacks 104. In one embodiment, the controlled removal of OPL 138 may include a timed etch.

Figure 21:
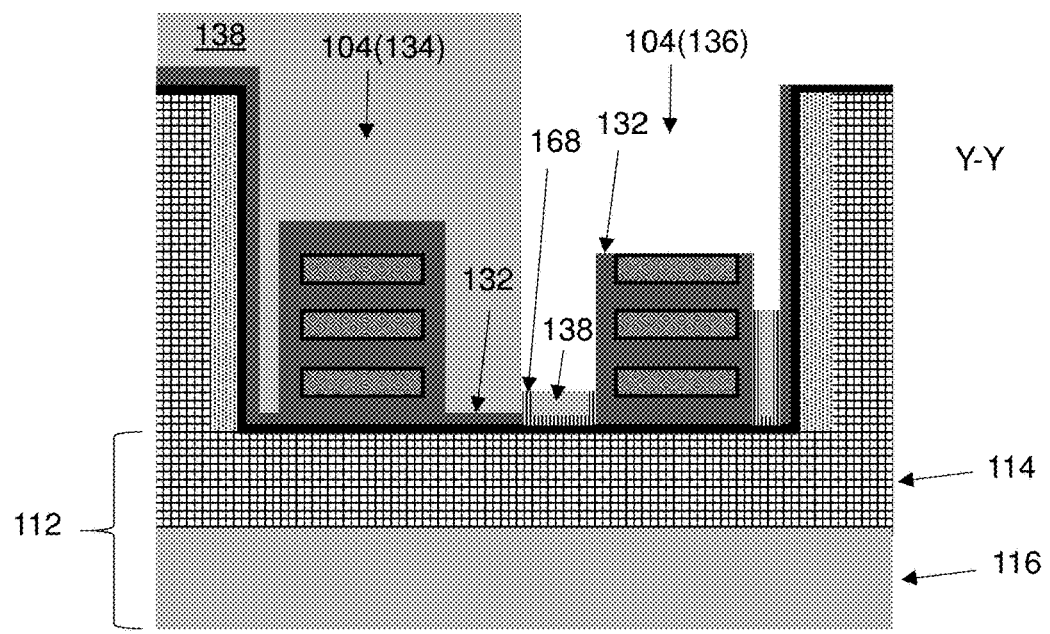
FIG. 21 shows a cross-sectional view, along line Y-Y in FIG. 1, of removing a portion of the isolation region in accordance with a further embodiment of the present disclosure.

FIG. 21 shows a process of the embodiment beginning at FIG. 16 including removing a portion of isolation region 168. Isolation region 168 may be removed by an etch selective to OPL 138 and high-k layer 130. In one embodiment, isolation region 168 may be removed between nanosheet stacks 104 to a depth of the remaining portion of OPL 138 on isolation region 168 between nanosheet stacks 104. The etch may result in a U-shaped portion of isolation region 168 separating first work function metal 132 on first nanosheet stack 134 from first work function metal 132 on second nanosheet stack 136, as shown.

Figure 22:
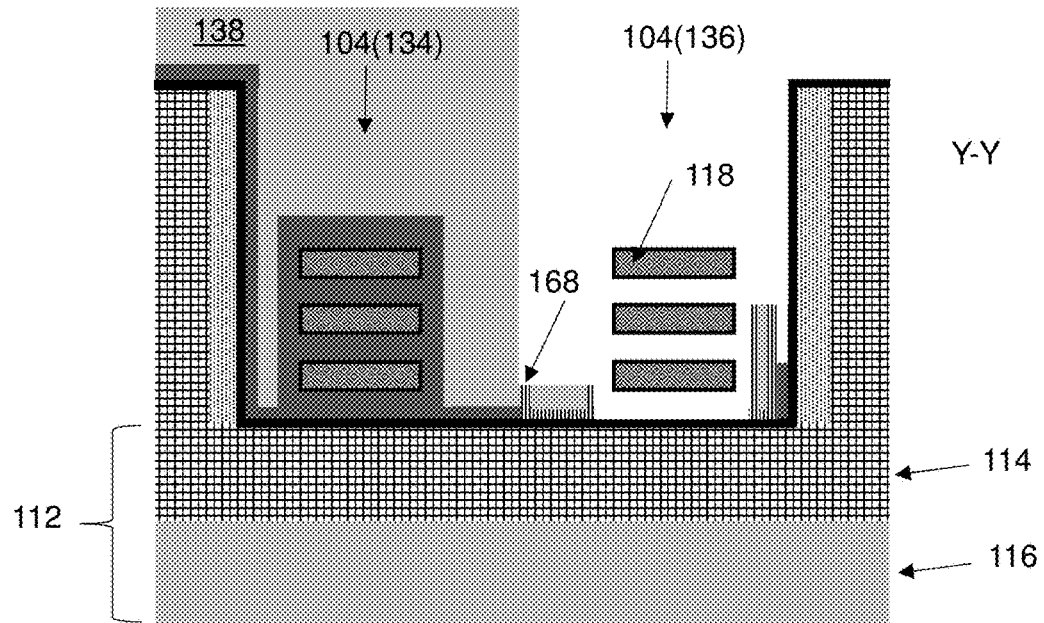
FIG. 22 shows a cross-sectional view, along line Y-Y in FIG. 1, of removing the first metal from the second nanosheet stack in accordance with a further embodiment of the present disclosure.

FIG. 22 shows a process of the embodiment beginning at FIG. 16 including removing first work function metal 132 from second nanosheet stack 136. In one embodiment, first work function metal 132 may be removed with an etch selective to isolation region 168 and OPL 138. As a result, first work function metal 132 may be removed from between nanosheets 118 of second nanosheet stack 136. As a result, high-k layer 130 on nanosheets 118 of second nanosheet stack 136 may be exposed. Similarly as described above regarding FIG. 7, an isotropic wet etch may be used to remove first work function metal 132 from second nanosheet stack 136. In this embodiment however, the isotropic etch does not create an undercut because isolation region 168 in this embodiment disconnects first work function metal 132 on first nanosheet stack 134 from first work function metal 132 on second nanosheet stack 136. As a result, first work function metal 132 on first nanosheet stack 134 may not be exposed to the etch during the removal of first work function metal 132 on second nanosheet stack 136.

Figure 23:
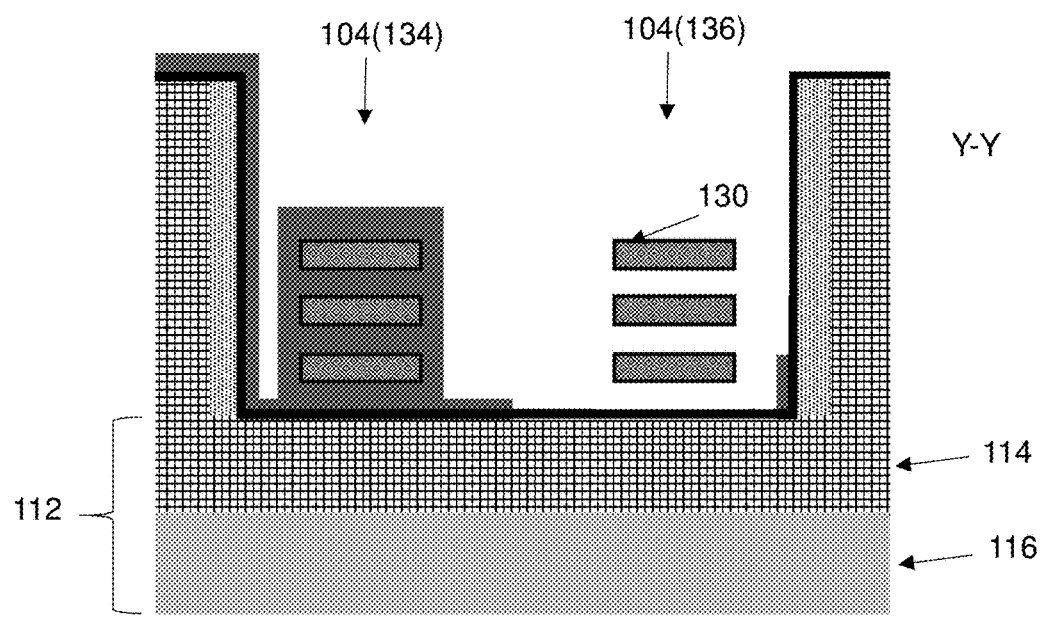
FIG. 23 shows a cross-sectional view, along line Y-Y in FIG. 1, of removing a mask from the first and second nanosheet stacks in accordance with a further embodiment of the present disclosure.

FIG. 23 shows a process of the embodiment beginning at FIG. 16 including removing OPL 138 and isolation region 168 (not shown separately). In one embodiment, OPL 138 may be removed with an etch selective to isolation region 168, first work function metal 132, and high-k layer 130. After the removal of OPL 138, isolation region 168 may be removed by an etch selective to first work function metal 130 and high-k layer 130. In one embodiment, OPL 138 and isolation region 168 may be removed by a single etch selective to first work function metal 132 and high-k layer 130. After the removal of OPL 138 and isolation region 168 in this embodiment as shown in FIG. 23, the process may continue as described above regarding FIG. 15. The process of depositing second work function metal 154 in this embodiment may be substantially the same process as described above in detail regarding FIGS. 10A and 15 and is not reiterated herein for brevity. However, similarly as described above regarding the embodiment beginning at FIG. 11, pillar 152 shown in FIG. 10A may be absent in this embodiment.

Figure 24:
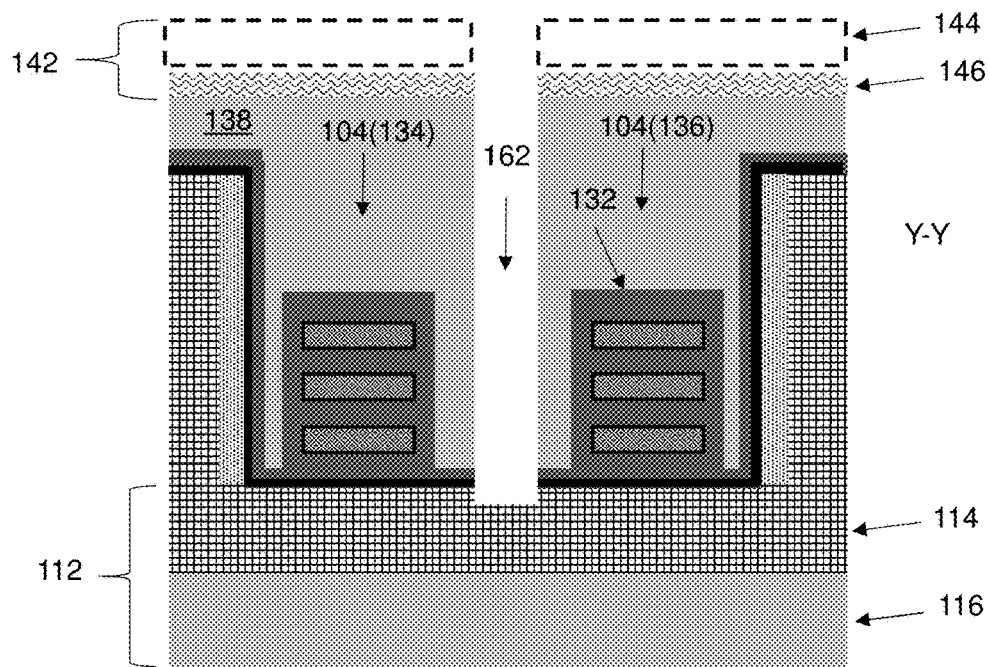
FIG. 24 shows a cross-sectional view, along line Y-Y in FIG. 1, of etching through a portion of the first metal to expose the substrate in accordance with a further embodiment of the present disclosure.

FIG. 24 shows a further embodiment of the present disclosure. FIG. 24 shows a cross-sectional view of a process similar to FIG. 12. As shown in FIG. 24, after depositing first work function metal 132 as described above regarding FIG. 11, OPL 138 may be deposited over the nanosheet stacks 104. In this embodiment, opening 162 may be formed between each of the nanosheet stacks 104. Opening 162 may be formed by masking (not shown) OPL 138 and using an anisotropic etch to remove a portion of OPL 138 to expose first work function metal 132. In this embodiment, forming opening 162 may include etching through first work function metal 132 and high-k layer 130 to expose substrate 112, disconnecting first work function metal 132 over first nanosheet stack 134 from first work function metal 132 over second nanosheet stack 136. In one embodiment, forming opening 162 includes etching though first work function metal 132 to expose high-k layer 130.

Figure 25:
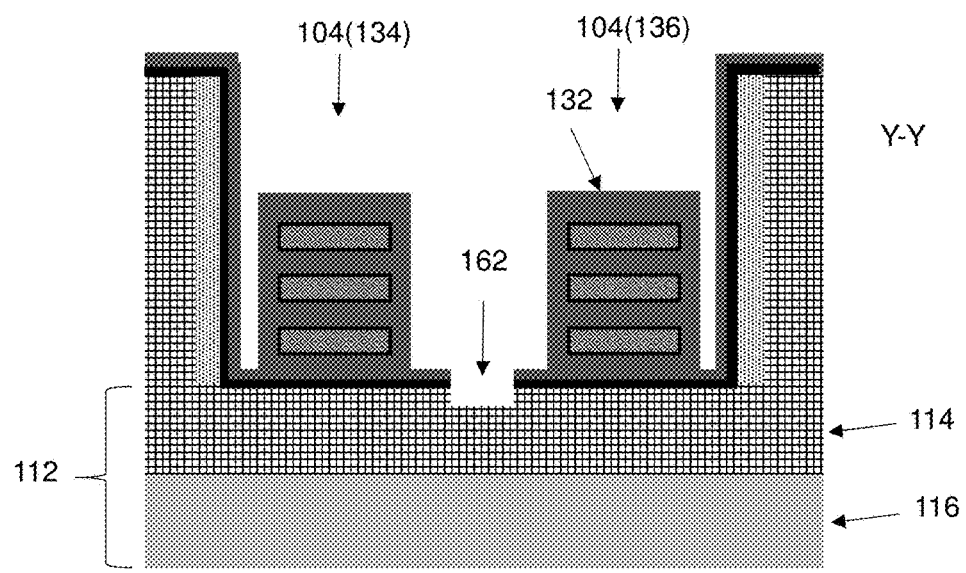
FIG. 25 shows a cross-sectional view, along line Y-Y in FIG. 1, of removing the mask covering the first and the second nanosheet stacks in accordance with a further embodiment of the present disclosure.

FIG. 25 shows a process of the embodiment beginning at FIG. 24. FIG. 25 shows a process of removing OPL 138, antireflective coating 146, and photoresist material 144. These layers may be removed by an etch selective to first work function metal 132 and substrate 112. As shown, OPL 138 may be removed from first nanosheet stack 134 and second nanosheet stack 136, exposing first work function metal 132.

Figure 26:
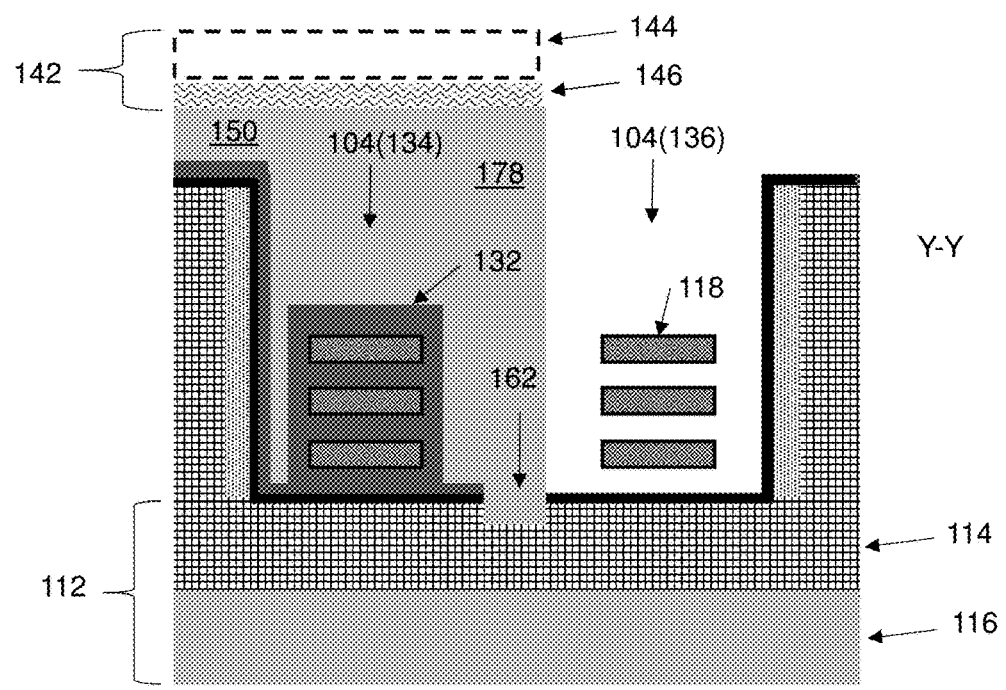
FIG. 26 shows a cross-sectional view, along line Y-Y in FIG. 1, of forming a soft mask covering the first portion of the first metal, a portion of the first metal connected with the first portion, and the exposed substrate, and removing the second portion of the first metal from the second nanosheet stack in accordance with a further embodiment of the present disclosure.

FIG. 26 shows a process of the embodiment beginning at FIG. 24. FIG. 26 shows the result of a process of forming second OPL 150 covering first work function metal 132 over first nanosheet stack 134 and opening 162. The portion of OPL 150 formed in opening 162 may be formed directly on substrate 112, as shown. Second OPL 150 may be formed over nanosheet stacks 104 similarly to OPL 138 described above, and mask 142 may be formed and patterned to expose a portion of OPL 150 over second nanosheet stack 136 (result shown). OPL 150 may then be removed from second nanosheet stack 136, exposing first work function metal 132 on second nanosheet stack 136 (not shown). OPL 150 may remain over first nanosheet stack 134, opening 162, and any first work function metal 132 connected to first work function metal 132 over first nanosheet stack 134. The remaining OPL 150 may be an isolation region 178 that separates first work function metal 132 over first nanosheet stack 134 from first work function metal 132 over second nanosheet stack 136. As shown in FIG. 26, first work function metal 132 may be removed from second nanosheet stack 136 with an isotropic etch. As described above, an isotropic etch may be required to remove first work function metal 132 from between the nanosheets 118 of second nanosheet stack 136. Isolation region 178 may prevent removal of first work function metal 132 over first nanosheet stack 134 during the isotropic etch.

Figure 27:
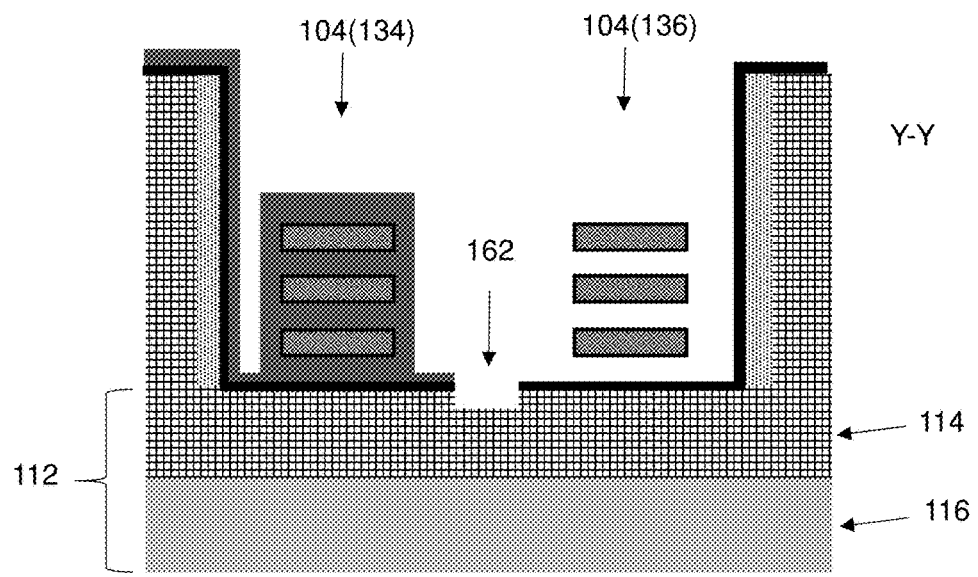
FIG. 27 shows a cross-sectional view, along line Y-Y in FIG. 1, of removing the mask covering the first metal and the exposed substrate in accordance with a further embodiment of the present disclosure.

FIG. 27 shows a process of the embodiment beginning at FIG. 24. FIG. 27 shows a process of removing isolation region 178. In this embodiment, isolation region 178 may be removed by an etch selective to first work function metal 132, similar to the removal of OPL 138 described above. As shown in FIG. 27, after the removal of isolation region 178, first work function metal 132 may be completely surrounding nanosheets 118 of first nanosheet stack 134, and no work function metal may be over second nanosheet stack 136. After the process shown in FIG. 27, second work function metal 154 may be applied to nanosheet stacks 104 as described above and shown in FIGS. 10A and 15. The process described in this embodiment may result in a structure similar to FIG. 15 described above.

In the embodiments shown in FIG. 10A and FIG. 15, first work function metal 132 may include a different metal than second work function metal 154. In one embodiment, first nanosheet stack 134 and first work function metal 132 may combine to form a PFET device while second nanosheet stack 136 and second work function metal combine to form a NFET device. In an embodiment where first nanosheet stack 134 will be a PFET device, first work function metal may include titanium nitride (TiN). In an embodiment where second nanosheet stack 136 will be a NFET device adjacent to a PFET device, second work function metal may include titanium carbide (TiC), or titanium aluminum carbide ($Ti_2AlC$).

Embodiments of the present method provide at least a pair of adjacent nanosheet FET devices 166. Referring to FIG. 10A, the pair of nanosheet FET devices 166 includes first nanosheet stack 134 disposed on substrate 112 and horizontally adjacent to second nanosheet stack 136. Each nanosheet stack 104 includes a plurality of vertically adjacent nanosheets 118 separated from each other by a distance. First work function metal 132 may be disposed on first nanosheet stack 134 such that first work function metal 132 completely surrounds each nanosheet 118 of first nanosheet stack 134. Second work function metal 154 may be disposed on second nanosheet stack 136 such that second work function metal 154 completely surrounds each nanosheet 118 of second nanosheet stack 136. Pillar 152 of first work function metal 132 may extend vertically between first nanosheet stack 134 and second nanosheet stack 136. With continued reference to FIG. 10A, in one embodiment a portion of second work function metal 154 may be disposed between pillar 152 and first nanosheet stack 134. As explained above, the present method provides a pair adjacent nanosheet FET devices 166 that may require different work function metals, without the risk of etching a significant undercut and damaging one of the FET devices.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. For example, while the present disclosure describes a process related to nanosheet devices, it is anticipated that a similar process may be applied to FinFET devices. The embodiment was chosen and described in order to best explain the principles of the disclosure and the practical application, and to enable others of ordinary skill in the art to understand the disclosure for various embodiments with various modifications as are suited to the particular use contemplated.

What is claimed is:

1. A method comprising:
   forming a first and a second nanosheet stack on a substrate, the first and the second nanosheet stacks being adjacent to each other and each including vertically adjacent nanosheets separated by a distance;
   depositing a first metal such that a first portion of the first metal surrounds each of the nanosheets of the first nanosheet stack and a second portion of the first metal surrounds each of the nanosheets of the second nanosheet stack;
   forming a nitride isolation region between the first nanosheet stack and the second nanosheet stack, the nitride isolation region extending from a surface of the substrate to a top of the first nanosheet stack and a top of the second nanosheet stack;
   removing the second portion of the first metal surrounding the second nanosheet stack with an etching process, the nitride isolation region preventing the etching process from reaching the first portion of the first metal and thereby preventing removal of the first portion of the first metal;
   removing the nitride isolation region; and
   depositing a second metal surrounding each of the nanosheets of the second nanosheet stack.

2. The method of claim 1, further comprising forming a layer having a high dielectric constant (high-k) on the substrate and the nanosheets of the first and second nanosheet stacks before the depositing of the first metal.

3. The method of claim 2, wherein the forming of the nitride isolation region includes:
   before depositing the first metal, forming the nitride isolation region such that the first portion of the first metal is only connected to the second portion of the first metal by a layer of the first metal formed around the nitride isolation region.

4. The method of claim 3, further comprising:
   before removing the second portion of the first metal, covering the first portion of the first metal and a portion of the first metal around the nitride isolation region with a soft mask,
   wherein the etching process removes only a fraction of the portion of the first metal between the soft mask and the nitride isolation region.

5. The method of claim 4, further comprising:
   prior to the forming of the nitride isolation region, forming a dummy gate that extends from the first nanosheet stack to the second nanosheet stack; and
   removing a portion of the dummy gate at a first location between the first nanosheet stack and the second nanosheet stack.

6. The method of claim 5, wherein the forming of the nitride isolation region includes forming the nitride isolation region between the first nanosheet stack and the second nanosheet stack at the first location where the portion of the dummy gate was removed.

7. The method of claim 2, wherein during the depositing of the first metal, a third portion of the first metal is deposited on the high-k layer, the third portion of the first metal connecting the first and the second portions of the first metal.

8. The method of claim 7, further comprising:
   disconnecting the first portion and the second portion of the first metal by etching through the third portion of the first metal to expose a layer underlying the first metal, and
   forming the nitride isolation region to cover a cross-section of the third portion of the first metal connected to the first portion of the first metal.

9. The method of claim 8, wherein disconnecting the first portion and the second portion of the first metal includes:
   covering the first and second portions of the first metal with a soft mask;
   creating an opening in the soft mask to expose the third portion of the first metal; and
   removing the exposed third portion of the first metal to expose the substrate.

10. The method of claim 9, wherein the forming of the nitride isolation region includes filling the opening, directly on top of the substrate, with a dielectric material.

11. The method of claim 8, wherein the disconnecting of the first portion and the second portion of the first metal by etching through the third portion of the first metal exposes the high-k layer.

12. The method of claim 11, wherein the forming of the nitride isolation region includes:
   covering the first portion of the first metal and a portion of the third portion of the first metal with a soft mask;
   removing at least a portion of the third portion of the first metal next to the soft mask but not covered by the soft mask to expose the high-k layer; and
   forming a dielectric material layer on the exposed high-k layer to a height above an exposed cross-section of the third portion of the first metal underneath the soft mask.

13. The method of claim 12, wherein the forming of the nitride isolation region includes forming the dielectric material layer conformally over the exposed high-k layer, the second nanosheet stack, and the soft mask covering the first portion of the first metal.

14. The method of claim 1, wherein the first metal includes a different material than the second metal.

15. The method of claim 1, wherein the first nanosheet stack is a PFET device, and the second nanosheet stack is a NFET device.

16. The method of claim 1, wherein the first metal is a PFET work function metal, and the second metal is a NFET work function metal.

17. The method of claim 1, wherein the removing of the second portion of the first metal includes removing the first metal from between the nanosheets of the second nanosheet stack with an isotropic etch.

18. The method of claim 1, wherein the nitride isolation region includes silicon nitride (SiN).

* * * * *